(12) United States Patent
Makin, III et al.

(10) Patent No.: US 12,113,123 B2
(45) Date of Patent: Oct. 8, 2024

(54) SUPERCONDUCTING MATERIALS, DEVICES, AND PROCESSES

(71) Applicant: The Board of Trustees of Western Michigan University, Kalamazoo, MI (US)

(72) Inventors: Robert A. Makin, III, Kalamazoo, MI (US); Steven Michael Durbin, Kalamazoo, MI (US)

(73) Assignee: The Board of Trustees of Western Michigan University, Kalamazoo, MI (US)

(*) Notice: Subject to any disclaimer, the term of this patent is extended or adjusted under 35 U.S.C. 154(b) by 0 days.

(21) Appl. No.: 18/070,765

(22) Filed: Nov. 29, 2022

(65) Prior Publication Data

US 2023/0121423 A1   Apr. 20, 2023

Related U.S. Application Data

(62) Division of application No. 17/011,648, filed on Sep. 3, 2020, now Pat. No. 11,545,563.

(60) Provisional application No. 62/895,678, filed on Sep. 4, 2019.

(51) Int. Cl.
| | |
|---|---|
| H01L 29/66 | (2006.01) |
| H01L 21/66 | (2006.01) |
| H10N 60/01 | (2023.01) |
| H10N 60/12 | (2023.01) |

(52) U.S. Cl.
CPC ........ *H01L 29/66893* (2013.01); *H01L 22/14* (2013.01); *H10N 60/01* (2023.02); *H10N 60/0912* (2023.02); *H10N 60/12* (2023.02)

(58) Field of Classification Search
CPC .......................... H10N 60/0856; H10N 60/30
See application file for complete search history.

(56) References Cited

U.S. PATENT DOCUMENTS

| | | |
|---|---|---|
| 3,309,553 A | 3/1967 | Kroemer |
| 3,413,533 A | 11/1968 | Kroemer et al. |
| 4,792,832 A | 12/1988 | Baba et al. |
| 4,833,101 A | 5/1989 | Fujii |
| 4,978,853 A * | 12/1990 | Hilal .................... H10N 60/203 250/336.2 |
| 8,981,382 B2 | 3/2015 | Gao |
| 2013/0240026 A1 | 9/2013 | Atwater et al. |

(Continued)

OTHER PUBLICATIONS

Makin et al.; "Alloy-Free Band Gap Tuning Across the Visible Spectrum"; Physical Review Letters 122, 256403 (2019) (Year: 2019).*

(Continued)

*Primary Examiner* — Syed I Gheyas

(57) ABSTRACT

A method of fabricating a superconducting device includes determining a target transition temperature and utilizing a predefined quantitative relationship between superconducting transition temperature and an order parameter for at least one superconducting material composition is utilized to select a superconductor material composition that is capable of providing a target transition temperature. Process parameters may be controlled to form a superconductor device comprising at least one superconductor material having a material composition providing the target transition temperature.

8 Claims, 13 Drawing Sheets

(56) References Cited

U.S. PATENT DOCUMENTS

2018/0083155 A1   3/2018  Mahajan et al.
2018/0122969 A1   5/2018  Olenick et al.

OTHER PUBLICATIONS

Makin et al., "Alloy-free Band Gap Tuning Across the Visible Spectrum," Department of Electrical and Computer Engineering, Western Michigan University, Kalamazoo, Michigan, Physical Review Letters 122, Issue 25, Jun. 2019. doi: 10.1103/PhysRevLett.122.256403 (6 pages).
Feldberg et al., "ZnSnN2: A New Earth-Abundant Element Semiconductor for Solar Cells," Department of Physics, University at Buffalo, The State University of New York, Buffalo, NY, USA, IEEE, 2011 978-1-4673-0066-7/12, pp. 002524-002527 (4 pages).
Feldberg et al., "Growth, Disorder, and Physical Properties of ZnSnN2," Appl. Phys. Lett. 103, 042109 (2013); doi: 10.1063/1.4816438, Jul. 2013 (6 pages).
Makin et al., "Order Parameter and Band Gap of ZnSnN2," Department of Electrical and Computer Engineering, Western Michigan University, Kalamazoo, Michigan, 978-1-5386-8529-7/18, 2018, IEEE, pp. 3865-3868.
Rühle, S., "Tabulated Values of the Shockley-Queisser Limit for Single Junction Solar Cells," Solar Energy Consulting, vol. 130, 2016, pp. 139-147, <http://dx.doi.org/10.1016/j.solener.2016.02.15>.
Dimroth et al., "Wafer Bonded Four-junction GaInP/GaAs//GaInAsP/GaInAs Concentrator Solar Cells with 44.7% Efficiency," Progress in Photovoltaics: Research and Applications, Prog. Photovolt: Res. Appl. 2014, vol. 22, published Jan. 13, 2014, pp. 277-282, https://doi.org/10.1002/pip.2475.
Senabulya et al., "Stabilization of orthorhombic phase in single-crystal ZnSnN2 films," AIP Advances 6, 075019 (2016); doi: 10.1063/1.4960109 (8 pages).
Bragg, W.L. and Williams, E.J., "Proceedings of the Royal Society of London, Series A, Containing Papers of a Mathematical and Physical Character," 145, 699 (1934).
Bragg, W.L. and Williams, E.J., "Proceedings of the Royal Society of London. Series A—Mathematical and Physical Sciences," 151, 540 (1935).
Williams, E.J. and Bragg, W.L.. "Proceedings of the Royal Society of London. Series A—Mathematical and Physical Sciences," 152, 231 (1935).
Makin et al., "Revisiting Semiconductor Band Gaps Through Structural Motifs: An Ising Model Perspective," Western Michigan University, Kalamazoo, Michigan (15 pages) (undated).
Keating, D.T. and Warren, B.E., "Long-Range Order in Beta-Brass and Cu3Au," Journal of Applied Physics, vol. 22, No. 3, pp. 286-290 (Mar. 1951).
Cowley, J.M., "X-Ray Measurement of Order in Single Crystals of Cu3au," Journal of Applied Physics, vol. 21, No. 1, pp. 24-30 (Jan. 1950).
Ryan, M.A., Peterson, M.W., Williamson, D.L., Frey, J.S., Maciel, G.E., and Parkinson, B.A., "Metal site disorder in zinc tin phosphide," Journal of Materials Research, vol. 2, No. 4, pp. 528-537 (Aug. 1987).
Nakatsuka, S. and Nose, Y., "Order-Disorder Phenomena and their Effects on Bandgap in ZnSnP2," J. Phys. Chem. C, vol. 121, No. 2, pp. 1040-1046 (Jan. 2017).
St.-Jean, P., Seryogin, G.A., and Francoeur, S., "Band gap of sphalerite and chalcopyrite phases of epitaxial ZnSnP2," Applied Physics Letters, vol. 96, No. 22, p. 231913 (2010).
Makin, R.A., York, K., Durbin, S.M., Senabulya, N., Mathis, J., Clarke, R., Feldberg, N., Miska, P., Jones, C.M., Deng, Z., Williams, L., Kioupakis, E., and Reeves, R.J., "Alloy-Free Band Gap Tuning across the Visible Spectrum," Phys. Rev. Lett. 122, 256403 (2019).
Ichimiya, A., Cohen, P.I., and Cohen, P.I., "Reflection high-energy electron diffraction," Cambridge University Press (2004).
Ji, X.H., Lau, S.P., Yang, H.Y., and Zhang, Q.Y., "Thin Solid Films" 515, 4619 (2007).
Kronig, R.D.L., Penney, W.G., and Fowler, R.H., "Quantum mechanics of electrons in crystal lattices," Proceedings of the Royal Society of London, Series A, Containing Papers of a Mathematical and Physical Character 130, 499 (1931).
Holonyak, N. and Bevacqua, S.F., "Coherent (Visible) Light Emission From Ga(As1xPx) Junctions," Applied Physics Letters 1, 82 (1962).
Morgan, R.S., "Reciprocal ribose interactions: A possible structural motif in and between RNA'S," Biosystems 5, 95 (1973).
Bleckley, S. and Schroeder, S.J., "Incorporating global features of rna motifs in predictions for an ensemble of secondary structures for encapsidated ms2 bacteriophage rna," RNA 18, 1309 (2012).
Anderson, C., Zucker, F., and Steitz, T., "Space-filling models of kinase clefts and conformation changes," Science 204, 375 (1979).
Makin, R.A. and Durbin, S.M., "Structural Motifs, Disorder, and the Efficacy of Viral Vaccines," bioRxiv 10.1101/2020.06.08.139907 (2020).
Achiele, K.P., "Paul Klee's 'Rhythmisches': A Recapitulation of the Bauhaus Years," Zeitschrift für Kunstgeschichte 57, 75 (1994).
Janssen, B., Burgoyne, J.A., and Honing, H., "Predicting Variation of Folk Songs: A Corpus Analysis Study on the Memorability of Melodies," Frontiers in Psychology 8, 621 (2017).
Cray, C. and Rowley, G., "Chinese and Western Composition: A Conversation between an Artist and an Art Historian," College Art Journal 15, 6 (1955).
Laks, D.B., Wei, S.-H., and Zunger, A., "Evolution of alloy properties with long-range order," Phys. Rev. Lett, 69, 3766 (1992).
Wei, S., Laks, D.B., and Zunger, A., "Dependence of the optical properties of semiconductor alloys on the degree of long-range order," Applied Physics Letters 62, 1937 (1993).
Burstein, E., "Anomalous Optical Absorption Limit in InSb," Phys. Rev. 93, 632 (1954).
Moss, T.S., "The interpretation of the properties of indium antimonide," Proceedings of the Physical Society, Section B 67, 775 (1954).
Slotboom, J., and De Graaff, H., "Measurements of bandgap narrowing in Si bipolar transistors," Solid-State Electronics 19, 857 (1976).
Dixon, J.R., and Bis, R.F., "Band Inversion and the Electrical Properties of PbxSn1—xTe," Phys. Rev. 176, 942 (1968).
Ma, J. Deng, H.-X., Luo, J.W., and Wei, S.-H., "Origin of the failed ensemble average rule for the band gaps of disordered nonisovalent semiconductor alloys," Phys. Rev. B 90, 115201 (2014).
Walukiewicz, W., Li, S., Wu, J., Yu, K., Ager, J., Haller, E., Lu, H., and Schaff, W.J., "Optical properties and electronic structure of InN and In-rich group III-nitride alloys," Journal of Crystal Growth 269, 119 (2004).
Bhuiyan, A.G., Sugita, K., Kasashima, K., Hashimoto, A., Yamamoto, A., and Davydov, V.Y., "Single-crystalline InN films with an absorption edge between 0.7 and 2 eV grown using different techniques and evidence of the actual band gap energy," Applied Physics Letters, 83, 4788 (2003).
Mang, A., Reimann, K., and Rübenacke, S., "Band gaps, crystal-field splitting, spin-orbit coupling, and exciton binding energies in ZnO under hydrostatic pressure," Solid State Communications 94, 251 (1995).
Kurimoto, E., Hangyo, M., Harisma, H., Yoshimoto, M., Yamaguchi, T., Araki, T., Nanishi, Y., and Kisoda, K., "Spectroscopic observation of oxidation process in InN," Applied Physics Letters 84, 212 (2004).
Haddad, D.B., Thakur, J.S., Naik, V.M., Auner, G.W., Naik, R., and Wenger, L.E., "Optical Band Gap Measurements of InN Films in the Strong Degeneracy Limit," MRS Proceedings 743, L11.22 (2002).
Inushima, T., Mamutin, V., Vekshin, V., Ivanov, S., Sakon, T., Motokawa, M., and Ohoya, S., "Physical properties of InN with the band gap energy of 1.1ev," Journal of Crystal Growth 227-228, 481 (2001).
Lacklison, D.E., Orton, J.W., Harrison, I., Cheng, T.S., Jenkins, L.C., Foxon, C.T., and Hooper, S.E., "Band gap of GaN films grown by molecular-beam epitaxy on GaAs and GaP substrates," Journal of Applied Physics 78, 1838 (1995).

(56) References Cited

OTHER PUBLICATIONS

Cho, S.-H., "Effects of growth temperature on the properties of ZnO thin films grown by radio-frequency magnetron sputtering," Transactions on Electrical and Electronic Materials 10, 185 (2009).

Potts, R.B., "Some generalized order-disorder transformations," Mathematical Proceedings of the Cambridge Philosophical Society 48, 106 (1952).

Ager, J.W., Walukiewicz, W., Shan, W., Yu, K.M., Li, S.X., Haller, E.E., Lu, H., and Schaff, W.J., "Multiphonon resonance Raman scattering in InxGa1—xN," Phys. Rev. B 72, 155204 (2005).

Guo, Q., Kusunoki, Y., Ding, Y., Tanaka, T., and Nishio, M., "Properties of InGaN Films Grown by Reactive Sputtering," Japanese Journal of Applied Physics 49, 081203 (2010).

Davydov, V.Y., Klochikhin, A.A., Emtsev, V.V., Smirnov, A.N., Goncharuk, I.N., Sakharov, A.V., Kurdyukov, D.A., Baidakova, M.V., Vekshin, V.A., Ivanov, S.V., Aderhold, J., Graul, J., Hashimoto, A., and Yamamoto, A., "Photoluminescence and Raman study of hexagonal InN and In-rich InGaN alloys," Physica Status Solidi (b) 240, 425 (2003).

Meher, S.R., Biju, K.P., and Jain, M.K., "Raman spectroscopic investigation of phase separation and compositional fluctuations in nanocrystalline InGa1xN thin films prepared by modified activated reactive evaporation," Physica Status Solidi (a) 208, 2655 (2011).

Robins, L., Paul, A., Parker, C., Roberts, J., Bedair, S., Piner., E., and El-Masry, N., "Optical Absorption, Raman, and Photoluminescence Excitation Spectroscopy of Inhomogeneous InGaN Films," MRS Proceedings 537, G3.22 (1998).

Sokolov, A.P., Shebanin, A.P., Golikova, O.A., and Mezdrogina, M.M., "Structural disorder and optical gap fluctuations in amorphous silicon," Journal of Physics: Condensed Matter 3, 9887 (1991).

Sood, A.K., Jayaram, K., and Muthu, D.V.S., "Raman and high-pressure photoluminescence studies on porous silicon," Journal of Applied Physics 72, 4963 (1992).

Tsu, R., Shen, H., and Dutta, M., "Correlation of Raman and photoluminescence spectra of porous silicon," Applied Physics Letters 60, 112 (1992).

Prokes, S.M. and Glembocki, O.J., "Role of interfacial oxide-related defects in the red-light emission in porous silicon," Phys. Rev. B 49, 2238 (1994).

Fogal, B., O'Leary, S., Lockwood, D., Baribeau, J.-M., Noël, M., and Zwinkels, J., "Disorder and the optical properties of amorphous silicon grown by molecular beam epitaxy," Solid State Communications 120, 429 (2001).

Lockwood, D.J. and Wang, A.G., "Quantum confinement induced photoluminescence in porous silicon," Solid State Communications 94, 905 (1995).

Cuong, T.V., Pham, V.H., Tran, Q.T., Hahn, S.H., Chung, J.S., Shin, E.W., and Kim, E.J., "Photoluminescence and Raman studies of graphene thin films prepared by reduction of graphene oxide," Materials Letters 64, 399 (2010).

Geim, A.K. and Novoselov, K.S., "The rise of graphene," Nature Matter 6, 183 (2007).

D'Innocenzo, V., Srimath Kandada, A.R., De Bastiani, M., Gandini, M., and Petrozza, A., "Tuning the Light Emission Properties by Band Gap Engineering in Hybrid Lead Halide Perovskite," J. Am. Chem. Soc. 136, 17730 (2014).

Dixit, V., Rodrigues, B., Bhat, H., Venkataraghavan, R., Chandrasekaran, K., and Arora, B., "Growth of InSb epitaxial layers on GaAs (001) substrates of LPE and their characterizations," Journal of Crystal Growth 235, 154 (2002).

Senthilkumar, V., Venkatachalam, S., Viswanathan, C., Gopal, S., Narayandass, S.K., Mangalaraj, D., Wilson, K.C., and Vijayakumar, K.P., "Influence of substrate temperature on the properties of vacuum evaporated InSb films," Crystal Research and Technology 40, 573 (2005).

Perez, J.M., Villalobos, J., McNeill, P., Prasad, J., Cheek, R., Kelber, J., Estrera, J.P., Stevens, P.D., and Glosser, R., "Direct evidence for the amorphous silicon phase in visible photoluminescent porous silicon," Applied Physics Letters 61, 563 (1992).

Tanino, H., Kuprin, A., Deai, H., and Koshida, N., "Raman study of free-standing porous silicon," Phys. Rev. B 53, 1937 (1996).

Brodsky, M.H. and Title, R.S., "Electron Spin Resonance in Amorphous Silicon, Germanium, and Silicon Carbide," Phys. Rev. Lett. 23, 581 (1969).

Laaziri, K., Kycia, S., Roorda, S., Chicoine, M., Robertson, J.L., Wang, J., and Moss, S.C., "High Resolution Radial Distribution Function of Pure Amorphous Silicon," Phys. Rev. Lett. 82, 3460 (1999).

Arnaudov, B., Paskova, T., Paskov, P.P., Magnusson, B., Valcheva, E., Monemar, B., Lu, H., Schaff, W.J., Amano, H., and Akasaki, I., "Energy position of near-band-edge emission spectra of InN epitaxial layers with different doping levels," Phys. Rev. B 69, 115216 (2004).

Manser, J.S. and Kamat, P.V., "Band filling with free charge carriers in organometal halide perovskites," Nature Photonics 8, 737 (2014).

Berggren, K.F. and Sernelius, B.E., "Band-gap narrowing in heavily doped many-valley semiconductors," Phys. Rev. B 24, 1971 (1981).

Kalt, H. and Rinker, M., "Band-gap renormalization in semiconductors with multiple inequivalent valleys," Phys. Rev. B 45, 1139 (1992).

Kong, L., Liu, G., Gong, J., Hu, Q., Schaller, R.D., Dera, P., Zhang, D., Liu, Z., Yang, W., Zhu, K., Tang, Y., Wang, C., Wei, S.-H., Xu, T., and Mao, H.-K., "Simultaneous band-gap narrowing and carrier-lifetime prolongation of organic-inorganic trihalide perovskites," Proceedings of the National Academy of Sciences 113, 8910 (2016), https://www.pnas.org/content/113/32/8910.full.pdf.

Makin, Robert A., Quantification and Influence of Cation Sublattice Disorder in Ternary Materials With Specific Application to SnSnN2, Western Michigan University, 2019.

Qin et al., Semiconducting ZnSnN2 thin films for Si/ZnSnN2 p-n junctions, Appl. Phys. Lett., 108, 142104, 2016, 6 pages.

Fioretti et al, "Combinatorial insights into doping control and transport properties of zinc tin nitride," Aug. 26, 2015, 12 pages.

\* cited by examiner

SUPERCONDUCTING MATERIALS, DEVICES, AND PROCESSES

CROSS-REFERENCE TO RELATED APPLICATIONS

The present application is a divisional of U.S. patent application Ser. No. 17/011,648 filed Sep. 3, 2020, entitled "BAND GAP ENGINEERED MATERIALS, which claims the benefit under 35 U.S.C. § 119(e) to U.S. Provisional Patent Application No. 62/895,678, filed Sep. 4, 2019, entitled "BAND GAP ENGINEERED MATERIALS." The entire disclosures of these applications are incorporated herein by reference.

STATEMENT REGARDING FEDERALLY SPONSORED RESEARCH OR DEVELOPMENT

This invention was made, in part, with government support under DMR-1410915 awarded by the NSF. The government has certain rights in the invention.

BACKGROUND OF THE INVENTION

Variations in the band gap of semiconducting materials affect various electrical characteristics of the material. In general, the band gap is the energy difference between the valence band maximum and the conduction band minimum. Various approaches to control or modify the band gap of semiconductor materials have been developed.

In general, an order parameter is a measure of changes following a phase transition. In the case of binary alloys, a degree of order of atom species A and B increases with decreasing temperature after a substance undergoes a transition from a disordered phase to an ordered phase. The "long range order parameter" generally refers to this degree of order. The order parameter can be calculated by measuring the integrated intensity of both a superlattice x-ray diffraction reflection, a feature present in the ordered phase, and a fundamental x-ray diffraction reflection, a feature present in both the ordered and disordered phases.

The order parameter may be controlled in metallic binary alloys utilizing known techniques. For example, a film of the material may be heated to a given temperature, at which the desired order parameter is obtained, followed by quenching the film at specific rates to preserve the degree of ordering (order parameter) in the film as it is brought back to room temperature. This technique has also been used to control the degree of cation sublattice order of $ZnSnP_2$, a heterovalent ternary material. Partial ordering of the cation sublattice has been quantified through the order parameter for $ZnSnP_2$. However, for other ternary materials, studies to date are primarily or exclusively qualitative. In molecular beam epitaxy (MBE) grown samples of $ZnSnP_2$, the order parameter may be controlled by varying the ratio of the cation fluxes.

Semiconductor materials are characterized by multiple properties that may be considered when fabricating electronic devices. An important property in many electronic devices is the band gap energy. The intrinsic gap of a semiconductor may be described as arising from the periodic potential describing the lattice in which a particular material crystallizes. In general, the intrinsic gap of a semiconductor is the energy difference between the valence band—the uppermost band containing electrons forming chemical bonds, and the band immediately above it, referred to as the conduction band. Disorder is known to affect the band gap.

Engineering of the band gap energy can be accomplished by alloying one or more compounds in order to achieve a desired value. It is also known that strain can be used to engineer the energy gap, exploiting heteroepitaxial structures potentially in tandem with alloying.

The concept of structural motifs provides a basis for describing a wide range of constructs, spanning such diverse fields as biology, music, and art. The term has its origin as a means of understanding RNA conformations and corresponding secondary structures, and structural similarities among different kinase enzymes performing the same function; in this context, a motif can be defined as a component of a structure with identifiable but variable order, where the resulting physical modification leads to altered properties or functionality.

In the case of semiconductor compounds, a structural motif describes any of the possible variants to the nearest neighbor bonding environment of a given atom. In an ideal crystal of a given compound with fixed stoichiometry, the number of different structural motifs is limited to a single type, and the occurrence of variations of this base motif occur at rates depending upon the degree of disorder and stoichiometry characterizing the corresponding lattice.

BRIEF SUMMARY OF THE INVENTION

One aspect of the present disclosure is a method/process of fabricating semiconductor materials having a desired band gap. The processes and techniques of the present disclosure provide for tuning of semiconductors across a broad range of band gaps. Although alloying and/or the use of rare metals may be utilized in a process according to the present disclosure, these conventional approaches are not required. The process may utilize a first correlation between process variables during synthesis of semiconductor materials and an order parameter. The process may also utilize a second correlation between band gap and an order parameter. The first and second correlations may be utilized to control one or more variables during synthesis of semiconductor materials to form materials having a desired band gap. A correlation between semiconductor stoichiometry and band gap may also be utilized during synthesis of semiconductor materials to provide a desired band gap in the semiconductor material. According to the present disclosure, a fundamental material property (band gap energy) is circumvented through design of motif composition (within fundamental limits established by the material).

Control over motif composition may be accomplished through variation of parameters that affect crystal growth. There are different types of motifs, and the present disclosure provides for varying the relative percentages of different motifs and stoichiometry. One way to control order parameter is to control the nitrogen species. For example, in a radio frequency inductively-coupled plasma source, the nitrogen species can be controlled by varying the flow rate of the nitrogen into the plasma source. Testing may be utilized to develop a correlation (e.g., graph) of the long-range order parameter squared ($S^2$) vs. nitrogen flow rate. The stoichiometry of a $ZnSnN_2$ film can be controlled via the Zn:Sn flux ratios (selected by setting a crucible temperature and then measuring flux using a quartz crystal microbalance or nude ionization gauge, for example). At a given Zn:Sn ratio, the substrate temperature may be adjusted to control the stoichiometry as well; due to the relatively high vapor pressure of Zn, at higher substrate temperatures, less Zn incorporates into the structure, allowing Sn-rich films to be formed. At lower growth temperatures, more Zn incorporates into the structure and Zn rich films can be grown.

Another aspect of the present disclosure is a method of fabricating a semiconductor device. The method includes determining a target band gap, and utilizing a predefined correlation between a band gap and a plurality of semiconductor material stoichiometries and cation or anion ordering to determine at least one semiconductor stoichiometry providing the target band gap. The method further includes controlling process parameters to form a semiconductor device comprising at least one semiconductor material having the target band gap.

The semiconductor device may optionally comprise a solid-state light-emitting diode (LED), and the semiconductor material may form an injector region and a base region. Controlling the process parameters may include tuning an order parameter and/or a stoichiometry of the semiconductor material such that a band gap of the material is larger in the injector region than in the base region.

The semiconductor device may optionally comprise a semiconductor junction transistor having a base region and an emitter region. Controlling the process parameters may include tuning a band gap of the base region and the emitter region utilizing at least one of an order parameter and stoichiometry of the semiconductor material such that the band gap of the semiconductor material in the emitter region is at least about twice as large as the band gap of the semiconductor material in the base region.

The semiconductor device may optionally comprise a single pn junction non-concentrator solar cell comprising a semiconductor material. Controlling the process parameters may include tuning a band gap of the semiconductor material utilizing at least one of an order parameter and a stoichiometry of the semiconductor material to a value between about 1.4 eV and about 1.6 eV.

The semiconductor device may optionally comprise a multijunction solar cell comprising a semiconductor material. Controlling the process parameters may include tuning a band gap of each layer of a multijunction cell by controlling at least one of a composition of the semiconductor material and an order parameter of the semiconductor material.

The semiconductor device may optionally comprise a tunnel diode having a semiconductor material with first and second layers having band gaps that have been tuned using stoichiometry and/or an order parameter, such that the top of the valence band for the first layer is at an energy level between the bottom of the conduction band and top of the valence band of the second layer.

The process may include controlling process parameters to form a semiconductor device having at least one semiconductor material having an anion or cation sublattice ordering providing the required band gap.

The method may optionally include fabricating a plurality of material samples having a semiconductor material composition, the stoichiometry of which can be varied between compositional end points. The process parameters may be varied to produce material samples having a range of order parameter values and band gaps for a plurality of stoichiometries. The method may include determining a predefined correlation between a band gap and a semiconductor material stoichiometry.

The method may optionally include determining at least one secondary correlation between at least one process parameter and at least one of an order parameter and semiconductor material stoichiometry. The at least one secondary correlation may be utilized to control at least one process parameter.

Another aspect of the present disclosure is a method of fabricating a superconducting device. The method includes determining a target transition temperature and utilizing a predefined correlation between transition temperature and superconductor material composition and an order parameter to determine a superconductor material composition providing the target transition temperature. The process parameters may be controlled to form a superconductor device comprising at least one superconductor material having a material composition providing the target transition temperature.

The superconductor device may optionally comprise a superconducting quantum interference device (SQUID), a bolometer, or a superconducting electrical connection.

Another aspect of the present disclosure is a method of fabricating a semiconductor material. The method includes: a) choosing a semiconductor material composition that can be varied between two points; b) fabricating a plurality of material samples having the chosen composition using different combinations of both parameters to produce a plurality of material samples having a range of values of an order parameter and a band gap; c) measuring the order parameter and band gap of at least two of the material samples fabricated at step b; d) determining a correlation between order parameter and band gap; and e) repeating steps b-d for a range of specific semiconductor material compositions at or between the two points. The method further includes selecting a desired (target) band gap for the order parameter, and utilizing the correlation between order parameter and band gap to determine a target semiconductor material composition and order parameter having the desired (target) band gap. The method further includes fabricating a semiconductor material, including setting and/or adjusting growth parameters to maintain at least one of the target order parameter and at least one of the target semiconductor material composition and the order parameter.

The method may optionally include determining at least one process correlation between an order parameter and a growth parameter.

The process may optionally include determining at least one process correlation between a semiconductor material composition and a growth parameter.

The method may optionally include utilizing the at least one process correlation to set and/or adjust parameters to maintain the target semiconductor composition and the order parameter.

The order parameter may optionally comprise a Bragg-Williams order parameter.

The semiconductor material composition may, optionally, be selected from a group consisting of mixed cation heterovalent ternary materials, perovskite materials, hybrid perovskite materials, quaternary alloys, quinary alloys, mixed anion heterovalent ternary materials, binary semiconductors, elemental semiconductors and elemental semiconductor alloys.

The method may optionally include alloying the semiconductor material composition to adjust the band gap.

Another aspect of the present disclosure is a method/process of fabricating superconducting materials having a desired superconducting transition temperature. The process may utilize a first correlation between synthesis process parameters and an order parameter. The process may also utilize a second correlation between energy gap and an order parameter. Stoichiometry and an order parameter can be independently controlled by process parameters to obtain a desired energy gap. A correlation between the superconducting transition temperature of a material and its superconducting energy gap may be used to control the transition temperature.

DETAILED DESCRIPTION

Figure 1:
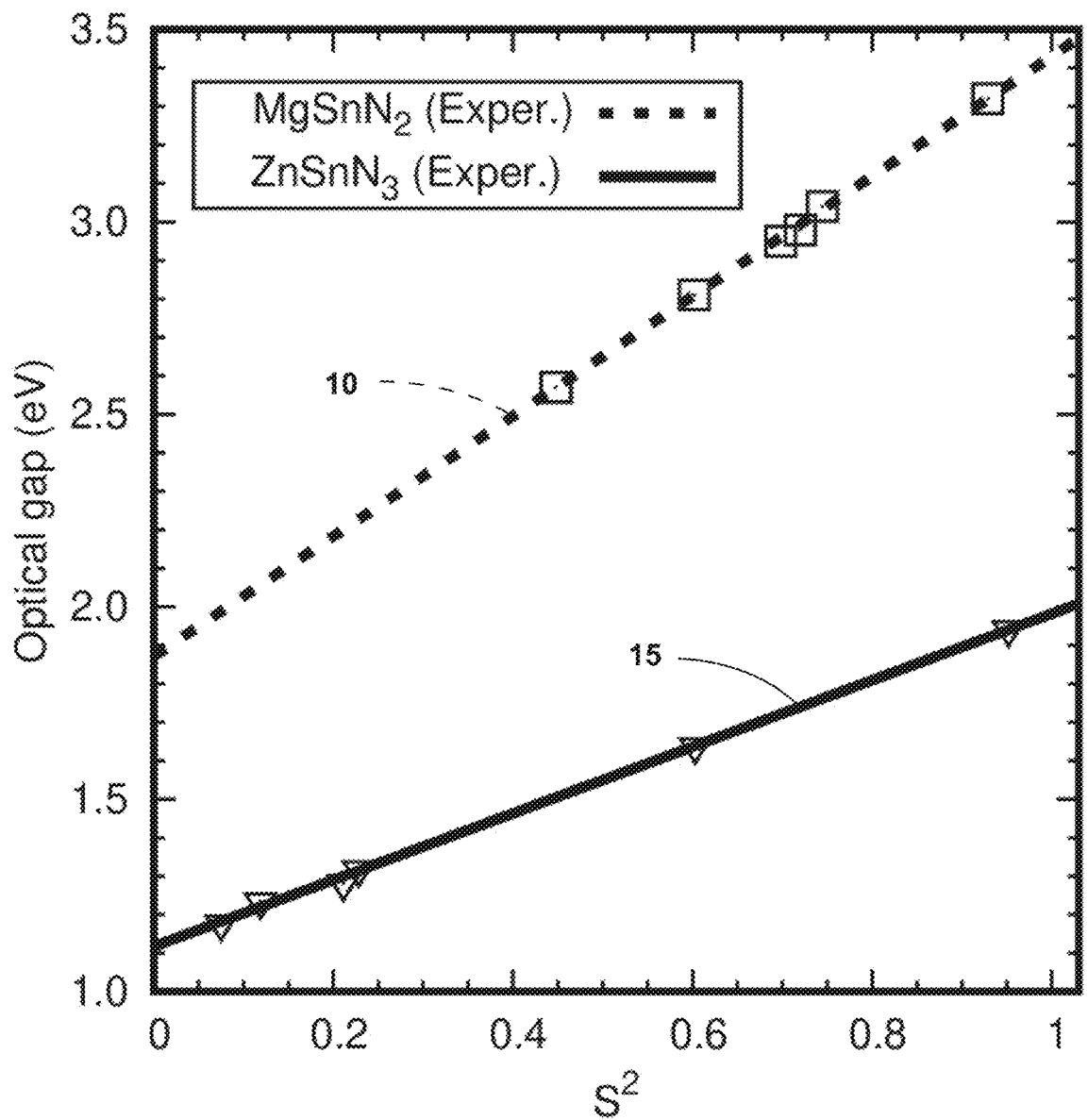
FIG. 1 is a graph showing experimental band gap of $ZnSnN_2$ and $MgSnN_2$ as a function of long range cation order parameter.

Conventional approaches to band gap engineering may not recognize the full range of achievable bandgap values. However, as discussed in more detail below, the present disclosure provides a way to accomplish a full range of band gaps in the context of structural motifs as viewed quantitatively with the assistance of an appropriately constructed model of lattice disorder (e.g., an order parameter). It will be understood that "different material compositions" (e.g. different semiconductor material compositions) as used herein generally encompasses differences in stoichiometry and differences in the elemental composition of the material.

In an otherwise interstitial-free lattice, the set of structural motifs that arise from disorder are defined through the range of possible anti-site defects. Since such defects can have large energies of formation, it may be argued that they are unlikely to form in lattices. A disordered lattice, however, has a higher entropy than a perfectly ordered lattice, and as such the driving force behind the formation of disordered lattices and their corresponding numerical distribution of the complete set of possible structural motifs is enthalpy (as for any endothermic process). Thus, by designing processes to be enthalpy driven instead of energy driven, it is possible to obtain a wide range of structural motif distributions. For example, by varying the conditions during crystal growth, different degrees of ordering can be achieved. The two-step process of annealing and quenching a sample is a known technique employed to obtain a desired degree of ordering. Additionally, non-equilibrium crystal growth techniques, which can access metastable structures, can be used to grow disordered lattices. However, even so-called equilibrium growth conditions may be only approximately so, and may therefore yield nonzero distributions of "nonequilibrium" structural motifs.

In general, ordering can be quantified using an appropriate order parameter, such as a Bragg-Williams order parameter, which is generally known in the art. However, it will be understood that other quantitative measures of order may be utilized, and, unless specifically stated otherwise, the term "order parameter" as used herein broadly refers to any quantitative measure of order (or disorder). Also, although some examples described herein may use a specific order parameter, it will be understood that the general principles are not limited to a specific order parameter material composition process parameter, etc. The symbol "S" is generally used herein to designate order parameter (e.g. a Bragg-Williams order parameter). In some cases the square of the order parameter is designated "$S^2$" herein and the square of the order parameter may be used for purposes of generating plots having straight line relationships (correlations) between an order parameter and another variable or parameter because it may be easier to extrapolate visually from a linear function. It will be understood that the present disclosure is not, however, limited to any specific way of describing or visually depicting the correlations described herein. For example, a material property may be plotted as a function of $S^2$ in order to produce a linear relationship (e.g. FIG. 3), whereas a process parameter may be plotted as a function of S (e.g. FIG. 5).

According to the present disclosure, a fundamental material property (band gap energy) is circumvented through design of motif composition (within fundamental limits established by the material). Control over motif composition may be accomplished through variation of parameters that affect crystal growth. There are different types of motifs, and the present disclosure provides for varying the relative percentages of different motifs and stoichiometry. One way to control order parameter is to control the nitrogen species. For example, as discussed in more detail below, in a radio frequency inductively-coupled plasma source, the nitrogen species can be controlled by varying the flow rate of the nitrogen into the plasma source. Testing may be utilized to develop a correlation (e.g., graph) of the long-range order parameter squared ($S^2$) vs. nitrogen flow rate. The stoichiometry of a $ZnSnN_2$ film can be controlled via the Zn:Sn flux ratios (selected by setting a crucible temperature and then measuring flux using a quartz crystal microbalance or nude ionization gauge, for example). At a given Zn:Sn ratio, the substrate temperature may be adjusted to control the stoichiometry as well. Due to the relatively high vapor pressure of Zn, at higher substrate temperatures, less Zn incorporates into the structure, allowing Sn-rich films to be formed. At lower growth temperatures, more Zn incorporates into the structure and Zn rich films can be grown.

The present disclosure involves controlling semiconductor fabrication process parameters to provide devices having a preselected (desired) band gap. The band gap is affected, at least in part, by the structural motifs of the material, which may be modeled using (for example) an Ising model to quantify the effect of order on band gap. As discussed in more detail below, atomic ordering and stoichiometry may be controlled to provide a wide range of band gap values for a particular semiconductor material. Specifically, a first correlation between band gap and order may be used in conjunction with a second correlation between order and a process parameter involved in a semiconductor fabrication process and/or stoichiometry to fabricate semiconductor devices having a preselected (desired) band gap.

One aspect of the present disclosure is a method of controlling band gap in semiconductor materials by controlling one or more of stoichiometry and cation (or anion) sublattice ordering. Cation sublattice ordering may be quantified via an order parameter S. Determination and use of the order parameter S are discussed in more detail below. Examples of such materials are mixed cation heterovalent ternary materials such as $ZnSnN_2$, $ZnGeN_2$, $ZnSiN_2$, $MgSnN_2$, $MgGeN_2$, $MgSiN_2$, $ZnSnP_2$, $ZnGeP_2$, $ZnSiP_2$, $MgSnP_2$, $MgGeP_2$, $MgSiP_2$, $CuGaS_2$, $CuInSe_2$, $CuGaSe_2$, $CuInSe_2$, and perovskite and hybrid perovskite materials such as $LaVO_3$, $SrTiO_3$, and $CH_3NH_3PbI_3$ (where the cations are methylammonium and Pb), $CH_3NH_3PbBr_3$, $CH_3NH_3PbCl_3$, quaternary alloys formed by mixing three cations such as CuInGaS, and quinary alloys formed by mixing four cations such as $ZnMgSnGeN_2$.

Another aspect of the present disclosure is a method of controlling band gap in semiconductor materials. The method may include controlling one or more of stoichiometry and anion sublattice ordering, wherein the anion sublattice ordering may be quantified by an order parameter S. Examples of such materials are mixed anion heterovalent ternary materials such as $Mg_4P_2S$, $Mg_4As_2S$, $Mg_4Bi_2S$, $Mg_4Sb_2S$, $Mg_4P_2Se$, $Mg_4As_2Se$, $Mg_4Bi_2Se$, $Mg_4Sb_2Se$, $Ca_4P_2S$, $Ca_4As_2S$, $Ca_4Bi_2S$, $Ca_4Sb_2S$, $Ca_4P_2Se$, $Ca_4As_2Se$, $Ca_4Bi_2Se$, $Ca_4Sb_2Se$, quaternary alloys formed by mixing three anions and quinary alloys formed by mixing four anions.

Another aspect of the present disclosure is a method of controlling the band gap in alloys of binary semiconductors. The method may include controlling one or more of the stoichiometry and ordering in substantially the entire lattice or a large enough portion of the lattice to provide a desired band gap. The ordering of the alloy may be quantified via an order parameter S. Examples of such materials are InGaN, InGaP, InAsP, and HgZnO. Another aspect of the present disclosure is a method of controlling band gap in binary semiconductors. The method may include controlling one or more of the stoichiometry and ordering in substantially the entire lattice or a large enough portion of the lattice to provide a desired band gap. The ordering of the binary material may be quantified via an order parameter S. Examples of such materials are II-VI compounds including CdTe, HgTe, CdSe, HgSe, CdS, HgS, HgO, CdO, ZnTe, MgTe, ZnSe, MgSe, ZnS, MgS, ZnO, MgO, MnTe, MnSe, MnS, MnO, InBi, InSb, InAs, InP, InN, GaBi, GaSb, GaAs, GaP, GaN, AlBi, AlSb, AlAs, AlP, AlN, BBi, BSb, BAs, BP, BN, $In_2O_3$, $Ga_2O_3$, $Al_2O_3$. Additional examples of such materials include ternary alloys formed by mixing two cations, ternary alloys formed by mixing two anions, quaternary alloys formed by mixing three cations, quaternary alloys formed by mixing three anions, and quaternary alloys formed by mixing two cations and two anions. Additional examples include two-dimensional binary compounds such as $MoS_2$, $MoSe_2$, $MoTe_2$, $WS_2$, $WSe_2$, and $WTe_2$.

Another aspect of the present disclosure is alloys of two-dimensional binary compounds formed by mixing either cations, anions, or both cations and anions. Multiple layer structures of two-dimensional binary compounds and binary compound alloys may also be formed according to other aspects of the present disclosure. The band gap of materials, such as $LiGaO_3$ and $CuInGaSe_2S_2$, may also be adjusted to a desired value by controlling crystal growth parameters.

Another aspect of the present disclosure is a method of controlling band gap in elemental semiconductors. The method may include controlling one or more of the stoichiometry and ordering of atomic vacancies and elements, which may include intentionally introducing impurities instead of, or in addition to, vacancies in substantially the entire lattice or a large enough portion of the lattice to provide a desired band gap. The ordering may be quantified via an order parameter S. Examples of such semiconductors are silicon, germanium, tin, diamond, phosphorene and graphene. This present disclosure further comprises multiple layer structures of two-dimensional elemental compounds.

Another aspect of the present disclosure is a method of controlling band gap in elemental semiconductor alloys. The method may include controlling one or more of the stoichiometry and ordering of the two elements in substantially the entire lattice or a large enough portion of the lattice to provide a desired band gap. The ordering may be quantified via an order parameter S. Examples of such semiconductors are SiC, GeSn, and SiSn.

Research to establish a process to grow high-quality single crystals of a semiconductor material, $ZnSnN_2$ has been conducted (N. Feldberg et al., Applied Physics Letters 103 (2013) 042109. DOI: 10.1063/1.4816438). This research developed a direct correlation between the band gap of the material and the crystalline order that characterizes the cation sublattice (zinc and tin atoms). Thus, $ZnSnN_2$ may provide the ideal band gap energy (about 1.5 eV) for a single-junction terrestrial solar cell by introducing disorder in the cation (zinc, tin) sublattice. Research to establish a process to grow high-quality crystals of a semiconductor material $MgSnN_2$ has been conducted. This research confirmed that the cation sublattice ordering determines the band gap energy. Experimentally determined values for band gap energy of stoichiometric $ZnSnN_2$ (from 1.12 eV to 1.98 eV) and for stoichiometric $MgSnN_2$ (from 1.87 eV to 3.43 eV) span the visible wavelengths of the electromagnetic spectrum. The two materials together then provide the basis for electronic devices capable of interacting with optical wavelengths between 0.36 micrometers and 1.1 micrometers.

X-ray diffraction data in conjunction with Raman spectroscopy data and electron diffraction data show that the degree of ordering $S^2$ can be assigned a numerical value as shown in Table 1:

|  | X-ray | Raman | RHEED | r |
|---|---|---|---|---|
| $ZnSnN_2$ Film | | | | |
| WPI-90 | 0.23 | 0.23 | 0.22 | 0.74 |
| WPI-91 | 0.07 | 0.07 | 0.07 | 0.63 |
| WPI-92 | 0.61 | 0.61 | 0.59 | 0.89 |
| WPI-93 | 0.21 | 0.21 | 0.21 | 0.73 |
| WPI-94 | 0.11 | 0.11 | 0.12 | 0.67 |
| WPI-95 | 0.95 | 0.95 | 0.95 | 0.99 |

-continued

| | X-ray | Raman | RHEED | r |
|---|---|---|---|---|
| MgSnN$_2$ Film | | | | |
| WPI-124 | 0.45 | 0.45 | 0.45 | 0.73 |
| WPI-125 | 0.73 | 0.72 | 0.72 | 0.86 |
| WPI-126 | 0.60 | 0.60 | 0.60 | 0.80 |
| WPI-127 | 0.70 | 0.70 | 0.70 | 0.85 |
| WPI-128 | 0.94 | 0.93 | 0.93 | 0.97 |
| WPI-129 | 0.74 | 0.74 | 0.74 | 0.87 |
| WPI-141 | 0.27 | 0.27 | 0.27 | 0.76 |

Table 1 comprises S$^2$ values for six ZnSnN$_2$ and six MgSnN$_2$ films determined using x-ray diffraction, Raman spectroscopy and RHEED. The last column, r, is calculated using the average of the S values for each sample, and is a measure of the fraction of cation atoms on the proper site, such that r=1 corresponds to a fully ordered cation sublattice, and r=0.5, the minimum value for stoichiometric material, corresponds to a fully randomized cation sublattice.

As shown in FIG. 1, optical data may be utilized to correlate the ordering to the band gap for MgSnN$_2$ and ZnSnN$_2$.

In particular, an Ising model (used in magnetism studies), extended to apply to known alloys (S. Wei et al., Applied Physics Letters 69 (1993) 1937) may be reformulated to explain the results. The long range order parameter, S, is the result of a quantitative analysis of the cation sublattice ordering. Referring again to FIG. 1, there is a linear correlation between band gap and S$^2$. Specifically, the line 10 shows a linear relationship between optical band gap (eV) and S$^2$ for ZnSnN$_2$, and line 15 shows a linear relationship between optical band gap (eV) and S$^2$ for ZnSnN$_3$. The test results suggest that linear correlations exist between band gap and virtually all other optical properties.

The linear correlation between band gap and order parameter (S$^2$) may be utilized to fabricate materials having a specific desired band gap. In particular, this correlation provides for band gap tunability spanning at least about 1 eV in the case of II-IV-N2 materials, such as ZnSnN$_2$ and MgSnN$_2$, where II and IV denote columns of the periodic table.

Referring again to FIG. 1, it is possible to completely or substantially span the visible spectrum, from the near infrared to the near ultraviolet, with these two materials (MgSnN$_2$ and ZnSnN$_2$). However, in contrast to conventional techniques (e.g., mixing to form an alloy), the present disclosure provides for variation of the long range order parameter, which can be controlled to a few percent via process parameters. Thus, the present disclosure does not necessarily require alloying to achieve a required (desired) band gap. However, alloying is not excluded, and alloying could be used in addition to controlling the long range order parameter and stoichiometry.

Figure 2:
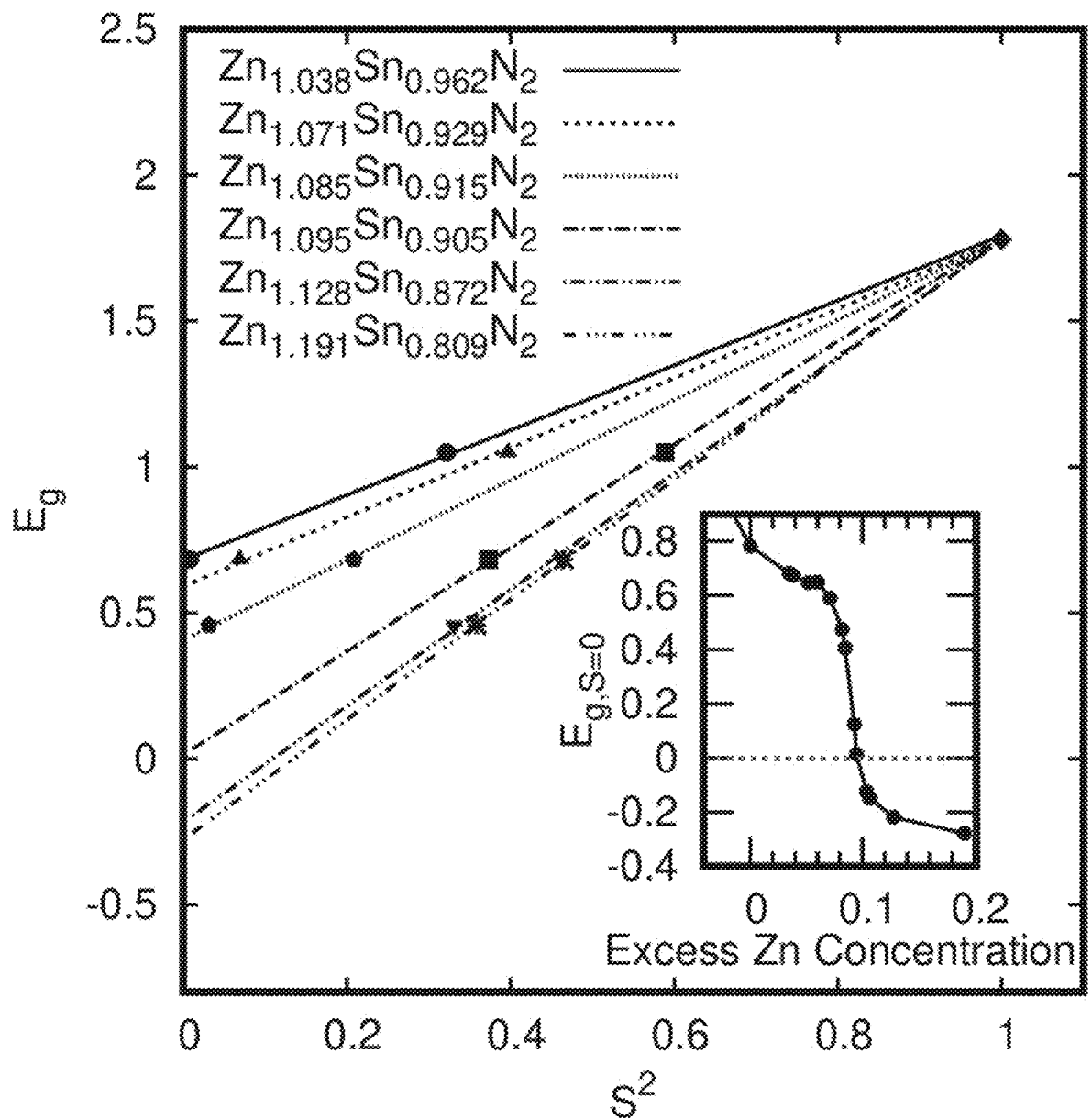
FIG. 2 is a plot of calculated band gap as a function of long range order parameter $S^2$.

FIG. 2 shows band gap (Eg) (vertical axis) as a function of the long range order parameter S$^2$ (horizontal axis). As shown in FIG. 2, the Ising model can also be applied to non-stoichiometric materials. The inset (FIG. 2) shows predicted band gap (Eg) for the S=0 case as a function of excess zinc concentration.

At the most extreme case of disorder (S=0), the Ising model predicted trend may be utilized to determine the anticipated band gap energy as a function of Zn (or Sn) excess, as shown in the inset of FIG. 2. This indicates that the band gap energy Eg can be tuned (selected) from a negative value, through zero, to positive values up to the fully ordered (maximum) value. A negative band gap value corresponds to inversion of the conduction and valence bands.

Figure 3:
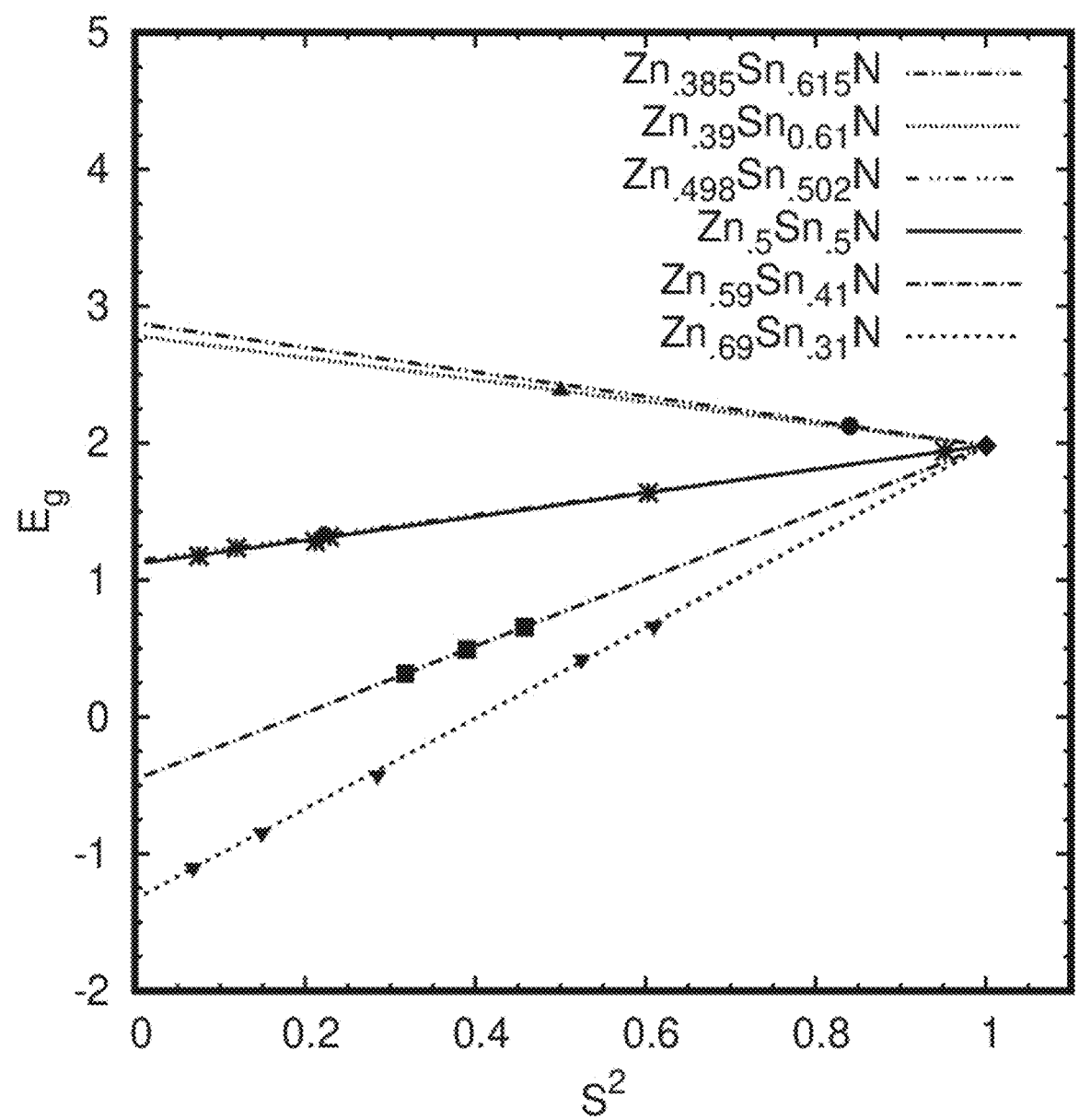
FIG. 3 shows experimentally-determined band gap energy as a function of long range order parameter $S^2$.

With reference to FIG. 3, extending beyond the limiting case of S=0, experimental results show that off-stoichiometric ZnSnN$_2$ materials may have a range of band gap values, as a function of cation ordering, up to the maximum value which corresponds to fully ordered stoichiometric material (S=1). As also shown in FIG. 3, a tin excess in ZnSnN$_2$ tends to increase the band gap, whereas a zinc deficit in this material tends to decrease the band gap. The order parameter provides a second degree of freedom to tune (adjust) the actual band gap value to provide a material having a desired band gap as required for a particular electronic device.

Devices according to the present disclosure may have a wide range of applications. For example, materials having very small band gaps may be of interest for far-infrared applications (e.g., semiconductor for lasers and detectors), and materials having very large band gaps may be of interest for ultraviolet semiconductor devices (e.g., ultraviolet photodetectors and diodes) and ultraviolet power electronic device applications. It will be understood that the data points of FIG. 3 were determined experimentally and the lines are shown as a visual guide to connect the measured data points (i.e., form a "map"). However, the lines are consistent with the Ising model predictions, and the lines (correlation) may therefore be utilized in a process according to the present disclosure to fabricate materials having a desired band gap. In general, both empirical and analytical correlations of material band gap as a function of stoichiometry and/or S may be utilized to fabricate materials having a desired (selected) band gap for use in electronic devices.

A method/process according to the present disclosure may be utilized in other mixed cation (and mixed anion) semiconductor compounds. Some examples include MgGeN$_2$, which has an estimated (ordered, stoichiometric) band gap of about 5 eV, and others such as the mixed perovskites. It will be understood that the ability to tune (adjust) the band gap over a range of at least about 5 eV or more provides for new ways of making heterostructures.

Another aspect of the present disclosure is a non-destructive method for determining the order parameter of single crystalline samples through the use of the correlation length and sample stoichiometry.

The coherence length refers to the size of the domain of atoms that produce constructive interference with an incident wave, e.g., such as that used for x-ray or electron diffraction. In terms of ordering, this corresponds to the size of ordered domains within the sample. However, the coherence length of the sample is convoluted with the coherence/divergence of the instrument. Thus, in order to determine the true correlation length of the sample, the coherence length of the instrument and sample are preferably deconvolved. The extracted film coherence length may then be scaled by the length of the sample probed by the measurement technique, for example, by the beam spot diameter, to obtain the correlation length for the sample. The correlation length varies between 0 for a completely disordered sample and 1 for a completely ordered sample.

The correlation length is related to S2 through:

$$S2=[\Gamma-(2x-1)2]/[1-(2x-1)2] \qquad (1)$$

Where for binary alloys x is the fractional composition of an element in the sample, and for ternary heterovalent materials x is the fractional percentage of a cation (e.g., x=1 for a cation sublattice of all zinc cations in ZnSnN$_2$). Γ is the correlation length and S is the order parameter.

For x-ray diffraction measurements the coherence length of a sample can be calculated by applying the Scherrer equation to a film peak:

$$L = K\lambda/(\beta \cos(\theta)) \quad (2)$$

Where L is the coherence length, K is a dimensionless shape factor, λ is the x-ray wavelength, β is the line broadening at half the maximum intensity (FWHM) after subtracting the instrumental line broadening, and θ is the Bragg angle.

For RHEED measurements, the coherence length may be measured using the FWHM of RHEED streaks. The FHWM of the RHEED streak for a sample is equal to:

$$L = 2\pi/(K\delta) \quad (3)$$

Where K is the wave number of the electron beam, δ the FHWM of the RHEED streak in radians, and L is the coherence length.

For materials with finite size effects, such as disorder, the Raman line shape is a Gaussian function in the form:

$$I\max * \exp(-0.5*(\omega-\omega 0)2/(L/2)2) \quad (4)$$

Where L is the coherence length, ω is the frequency, and ω0 is the central frequency. Thus, by fitting the Raman line with a Gaussian function, the coherence length may be extracted from the resulting fit.

Stoichiometry may be determined using a technique, such as Rutherford backscattering spectrometry (RBS). However, other techniques can be used if an appropriate standard is utilized. Examples of other techniques include energy dispersive x-ray analysis (EDX) and secondary ion mass spectrometry (SIMS).

The methodology to determine the order parameter may comprise obtaining the coherence length L, by applying the appropriate equation (Eq. 2, 3 or 4 above) to the collected data. The coherence length may then be scaled by the length of the sample probed by the measurement technique in order to obtain the correlation length, Γ. The order parameter of the material (film) can be found using Equation 1, along with the correlation length and sample stoichiometry.

Figure 4:
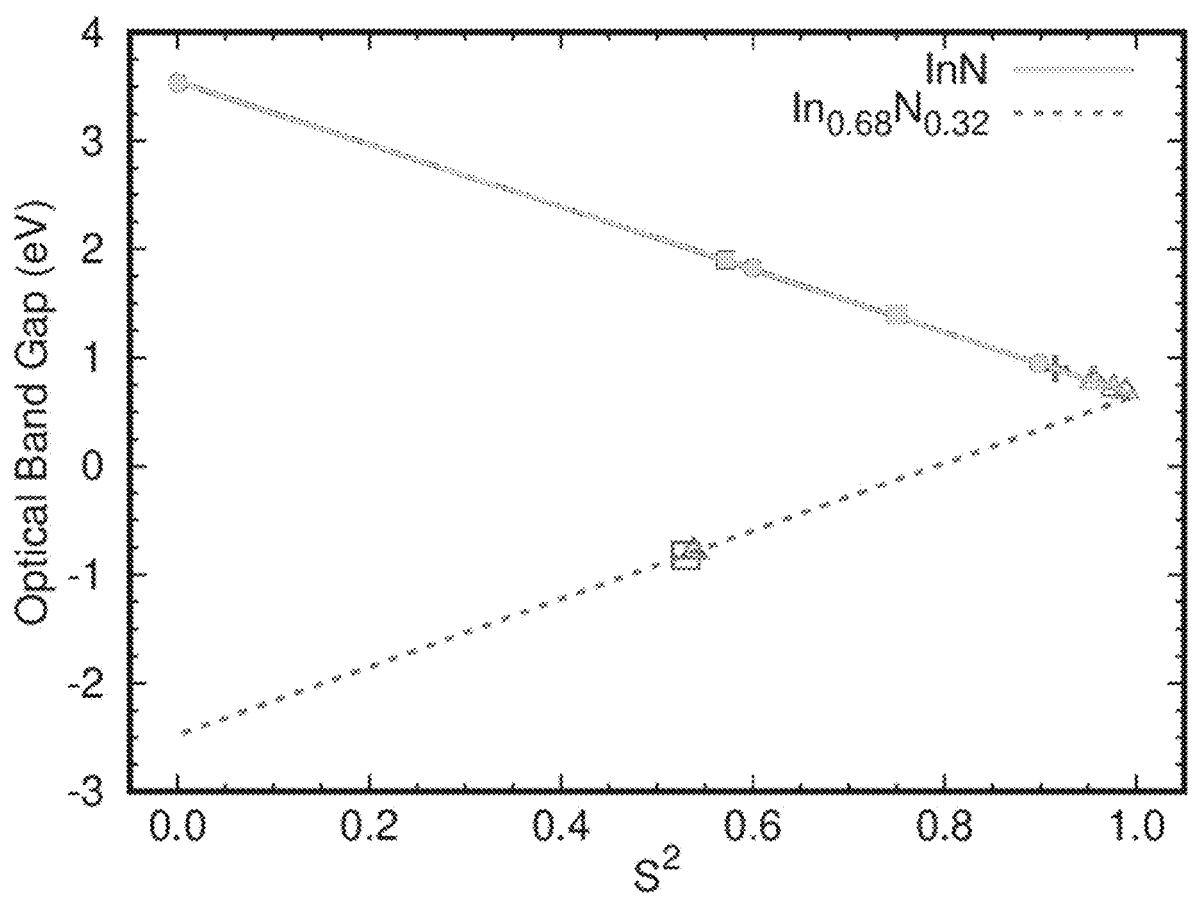
FIG. 4 shows the experimentally-determined optical band gap energy of indium nitride thin films as a function of extracted order parameter.
Figure 4A:
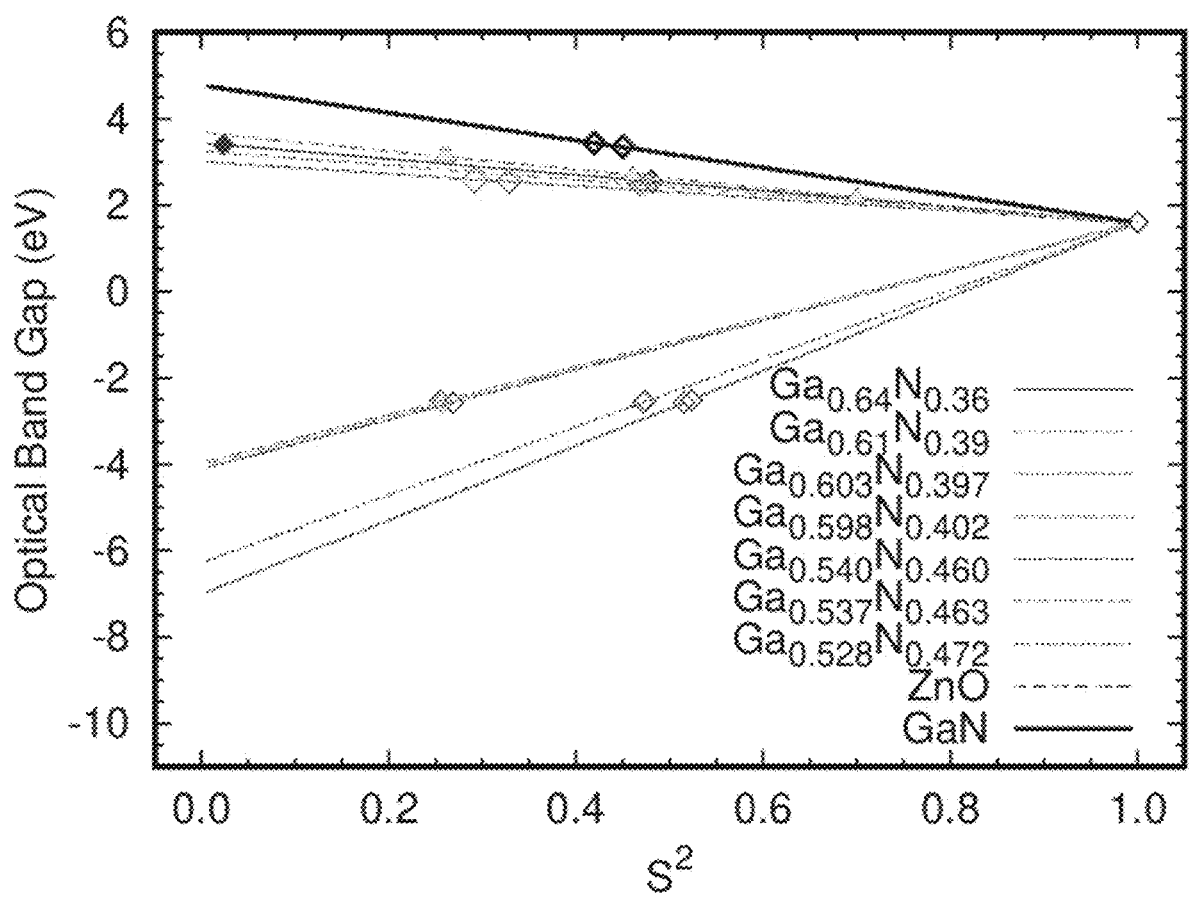
FIG. 4A shows experimentally-determined optical band gap of GaN and ZnO as a function of extracted order parameter, as well as extrapolated values which can be accessed.

With reference to FIG. 4, the process discussed above may be applied to materials, such as indium nitride, a binary endpoint in the family of InGaN, to determine the correlation between optical band gap (ev) and $S^2$. InGaN may be used for many applications, such as blue LEDs, white LEDs, blue laser diodes, and solid state lighting. FIG. 4A shows the results of applying the process (analysis method) to wide band gap semiconductors GaN (the other binary endpoint of InGaN) and ZnO.

Figure 4B:
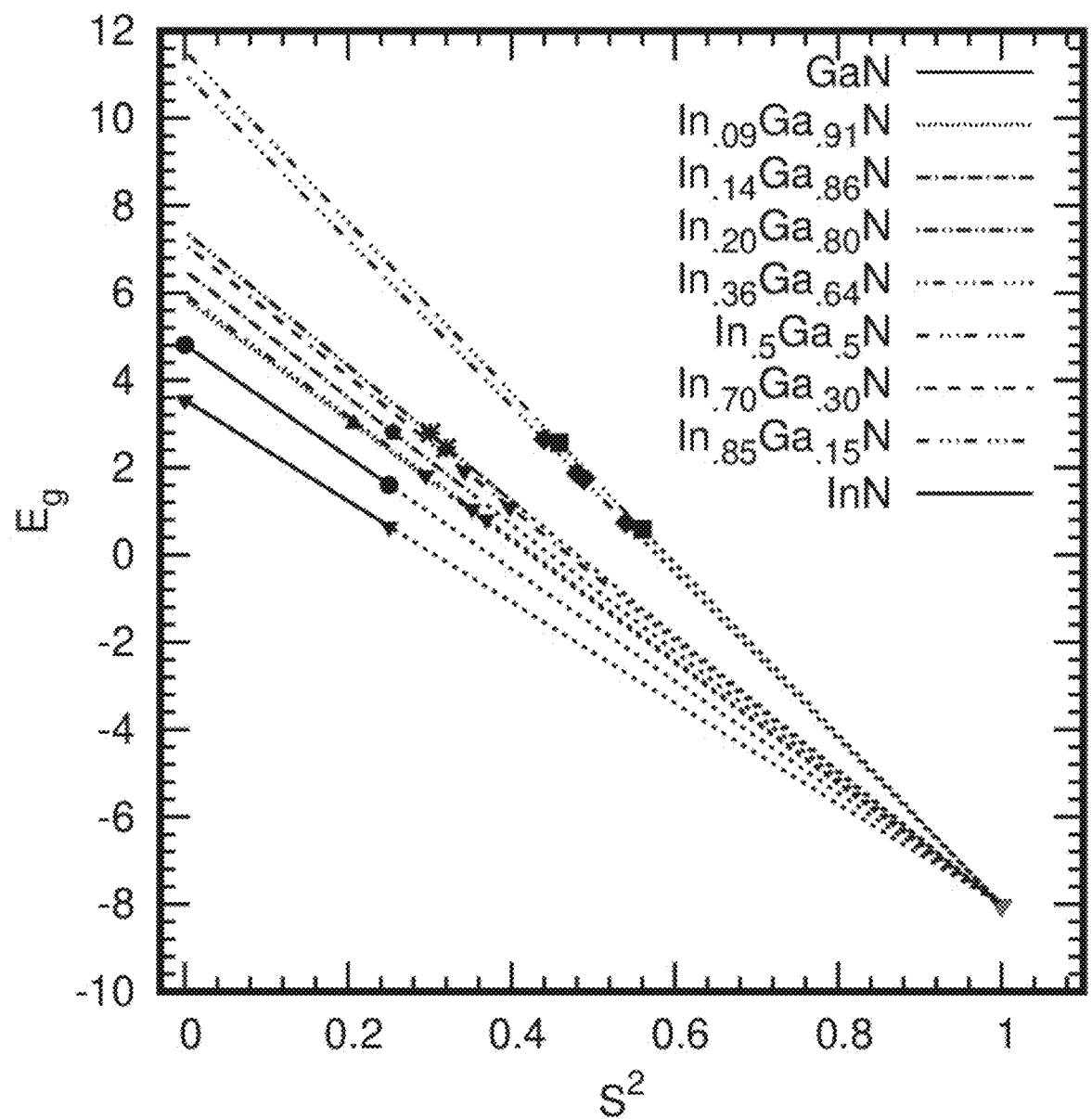
FIG. 4B shows experimentally-determined optical band gap of InGaN as a function of extracted order parameter, as well as extrapolated values which can be accessed.

The points shown in FIGS. 4 and 4A are a combination of experimental data and results extracted from the literature. The same Ising model consistent behavior (linear correlation) previously confirmed for $ZnSnN_2$ and $MgSnN_2$ is clearly in evidence, as all points fall on a line as expected. Thus, the motif distribution, in conjunction with stoichiometry, is intricately tied to the order parameter in the case of ternary heterovalent semiconductors and also significantly affects the band gap of even simple binary compounds, and by extension, alloy materials such as InGaN (FIG. 4B).

Another aspect of the present disclosure is a method for tuning (adjusting) the order parameter of a sample (e.g., a material used in a semiconductor device) using active nitrogen species. Also, as discussed below, experimental evidence demonstrates that negative values of the band gap energy (inverted bands) can be accessed/achieved.

Although the order parameter of some materials (e.g., films) may be controlled to provide a desired band gap through thermal treatment, it may be problematic for $ZnSnN_2$ and other ternary materials, where the critical order/disorder transition temperatures occur at values that are typically well above the melting point or decomposition points of the materials. For example, in the case of $ZnSnN_2$, the critical temperature is approximately 3500 K. For materials with a larger ΔEg the critical temperatures are even higher. For example, $MgSnN_2$ has a critical temperature of approximately 9900 K. Another aspect of the present disclosure is a process to control/adjust the order parameter (and band gap) without relying solely on thermal treatment.

For example, the order parameter may be controlled by changing the ratio of cation fluxes during nonequilibrium crystal growth to alter the order parameter by changing the stoichiometry of the film. This does not require changing the degree of ordering on the cation sublattice at a fixed cation ratio. Thus, the order parameter can be controlled, without necessarily relying on thermal treatments or varying flux ratios. Thus, the present disclosure provides for adjustment of the band gap by varying the structural motif composition at the target stoichiometry (i.e., column II to column IV atom ratio, in the case of II-IV-V2 compounds).

Figure 4C:
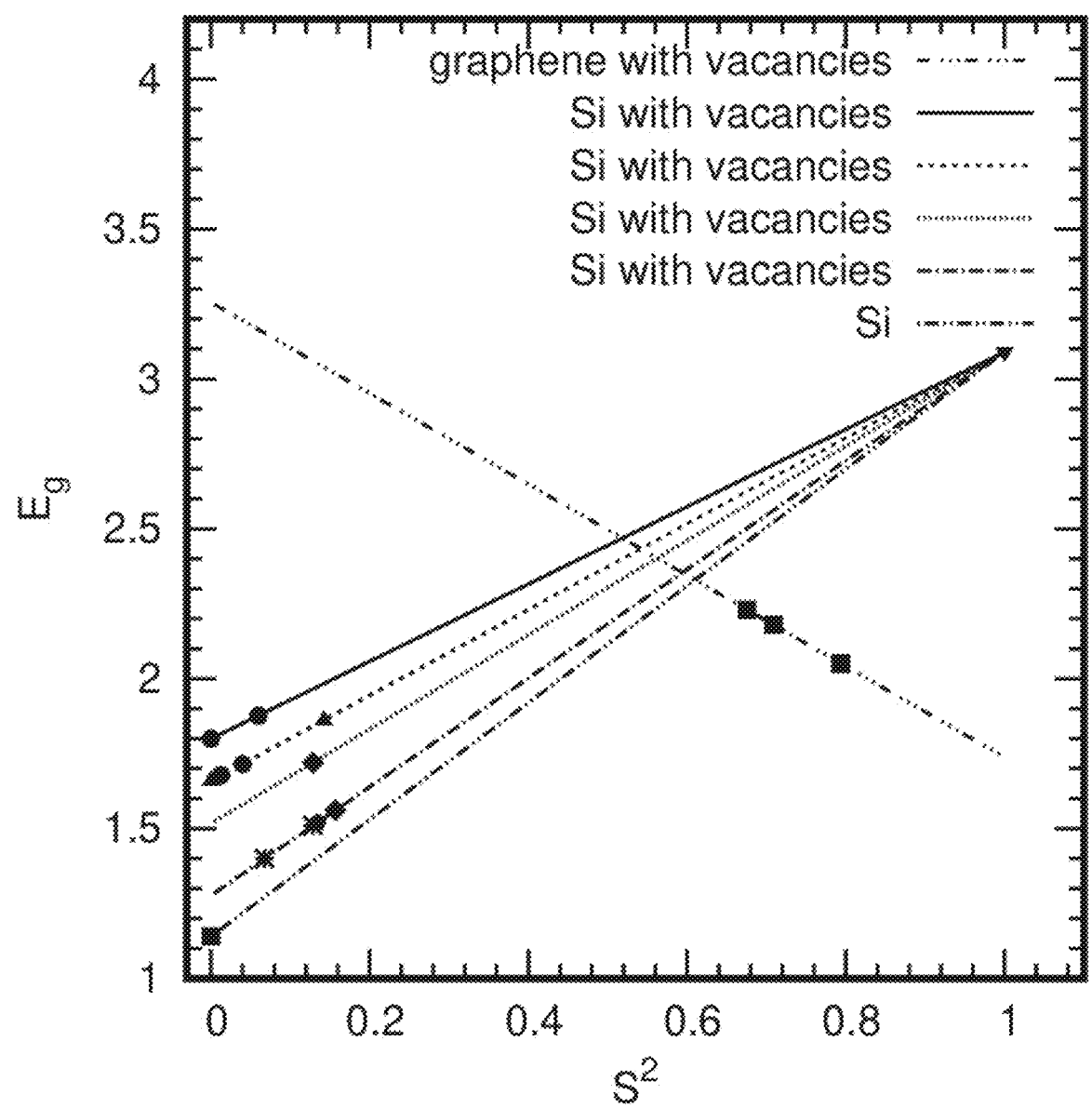
FIG. 4C shows experimentally-determined band gap of nanoporous graphene and silicon as a function of order parameter, for different amounts of atomic vacancies.

Another aspect of the present disclosure comprises controlling the band gap energy through ordering (vacancies, silicon, graphene, FIG. 4C).

Vacancies can be generated through variation of process parameters during crystal growth, or ex-situ using irradiation, for example bombardment with ions, electrons, or other energetic/accelerated particles.

For plasma-assisted molecular beam epitaxy (PAMBE) growth processes according to an aspect of the present disclosure, the order parameter can be systematically controlled by varying the ratio of active nitrogen species present in the plasma source, which may be monitored by a spectrometer. Monitoring may involve optical monitoring via a port window, if the plasma source has a port window. Monitoring may comprise total intensity. Alternatively, the wavelengths may be separated utilizing a spectrometer. Two active nitrogen species produced by plasma sources used in PAMBE are excited molecular nitrogen and atomic nitrogen. The ratio of nitrogen species populations may be monitored in real time using a spectrometer to monitor the light emitted from the nitrogen plasma. The excited molecular nitrogen and atomic nitrogen emit light at known frequencies, and thus the intensity of light emitted at the known frequencies is proportional to the respective active nitrogen species populations.

Figure 5:
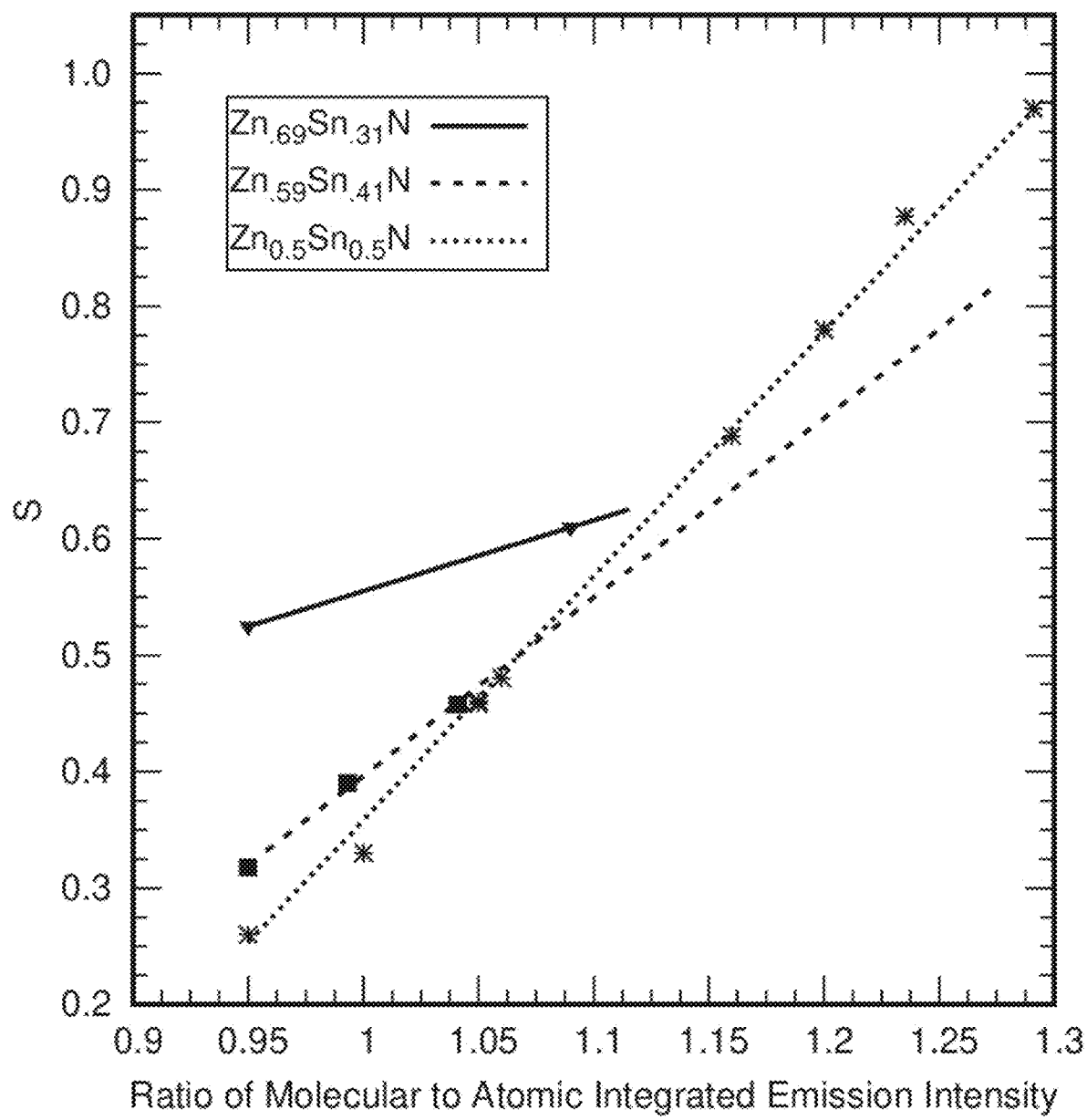
FIG. 5 shows experimentally-determined order parameter S of samples as a function of the ratio of active molecular to atomic emission intensity observed in plasma for given growth conditions.

FIG. 5 shows the experimentally-determined relationship between the active nitrogen species ratio and the order parameter (S) of the resulting materials (films). The trend lines in FIG. 5 show a linear relationship between the order parameter and the ratio of molecular to atomic nitrogen at a fixed Zn:Sn ratio (the latter yielding the three separate stoichiometries plotted). More specifically, for a given Zn:Sn ratio, the more molecular nitrogen (relative to atomic nitrogen) present in the plasma corresponds to a higher S value of the film. Conversely, the more atomic nitrogen present in the nitrogen plasma (relative to molecular nitrogen) corresponds to a lower S value of the film.

Because the vapor pressures of Zn and Sn are significantly different, preferential re-evaporation of Zn occurs. This may require use of somewhat extreme flux ratios (the arrival rate per unit area of atoms). For example, gallium arsenide may be grown with a 10:1 As:Ga vaport pressure ratio since As is more volative. In contrast, $ZnSnN_2$ may be grown at a ratio of about 100:1 Zn:sn. If the substrate temperature is increased, the ratio typically needs to increase somewhat as well. However, it would be expected that forming a Sn-rich film would decrease the Zn:Sn ratio while holding all other parameters constant. To produce a Sn-rich film, the Zn:Sn ratio would be increased and/or the substrate temperature could be reduced somewhat to cause more zinc to be retained in the crystal.

The process may include determining a target stoichiometry and $S^2$ (FIG. 3) that correspond to a desired band gap. The process may further include fabricating a film sample. If the crystal quality of the sample is acceptable, the stoichiometry of the sample is determined (measured using) a suitable technique (e.g., Rutherford Backscattering Spectrometry). If the measured stoichiometry is not equal to the target stoichiometry, the flux ratio and/or the substrate temperature can be adjusted to vary the stoichiometry, then iterated if needed to produce the desired (target) stoichiometry. The target stoichiometry may comprise a range of stoichiometries that are capable of providing a desired band gap (FIG. 3). In general, correlations between process parameters, stoichiometry, order parameter, and band gap may be utilized to fabricate materials having a desired (target) band gap.

The excited molecular nitrogen produced by plasma sources has a lower potential energy than the atomic nitrogen generated by plasma sources. As a result, atomic nitrogen has been viewed as detrimental to high quality crystalline growth and active molecular nitrogen species have been seen as the preferred form of active nitrogen for PAMBE growth of III-N materials. However, this is not necessarily the case for ternary materials. At growth (substrate) temperatures near 400° C., atomic nitrogen provides the energy necessary to form the metastable low-S value lattices, while molecular nitrogen aids in the formation of high-S value structures.

Experiments were performed to further explore the potential range of band gap energies according to the present disclosure. Specifically, flux ratio, substrate temperature, and nitrogen plasma conditions (RF power and flow rate) were chosen to achieve negative values of band gap energy. As seen in FIG. 3, the optical transmission data confirms that negative band gap energy can be achieved (i.e., the bands are inverted).

Figure 6:
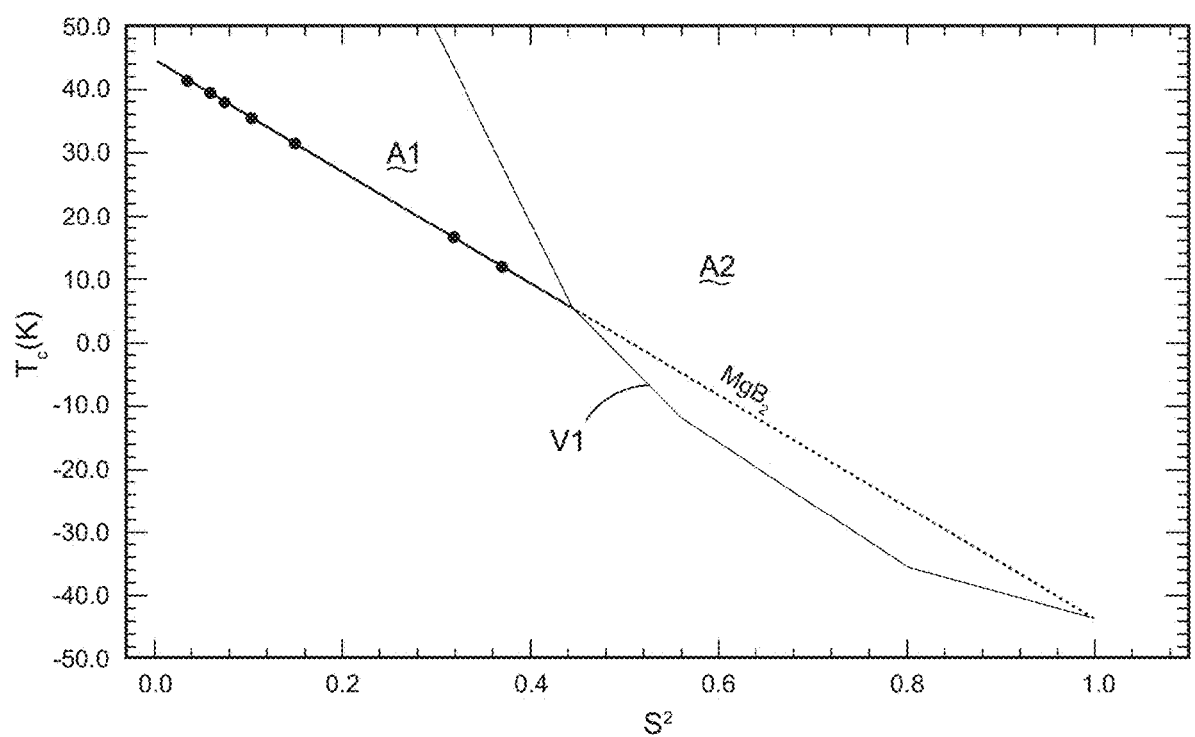
FIG. 6 is a plot of critical temperature (above which there is no superconducting state) as a function of long-range order parameter (plotted as $S^2$) for $MgB_2$.

Another aspect of the present disclosure involves use of long-range order parameter ($S^2$) to shift the superconducting energy gap to thereby realize room temperature (or above) superconductivity. The methodology described in more detail above may be applied to various superconducting materials. For example, FIG. 6 is a plot of critical temperature (above which there is no superconducting state) as a function of long-range order parameter (plotted as $S^2$) for $MgB_2$. The points on the $MgB_2$ line of FIG. 6 are extracted from existing literature. The slope $MgB_2$ line represents nominally stoichiometric material. Negative temperatures on this type of Ising model plot (map) indicate band inversion and a transition to a superinsulating, as opposed to a superconducting, state. The area "A1" (approximate) denotes potentially achievable transition temperatures that may be achieved by deviating from a nominally stoichiometric material $MgB_2$. The area "A2" (approximate) comprises unphysical combinations. The areas A1 and A2 in FIG. 6 are divided by a vertical line "V1" corresponding to an $S^2$ value of approximately 0.44. It will be understood that $MgB_2$ constitutes a "Type I" superconductor.

Figure 7:
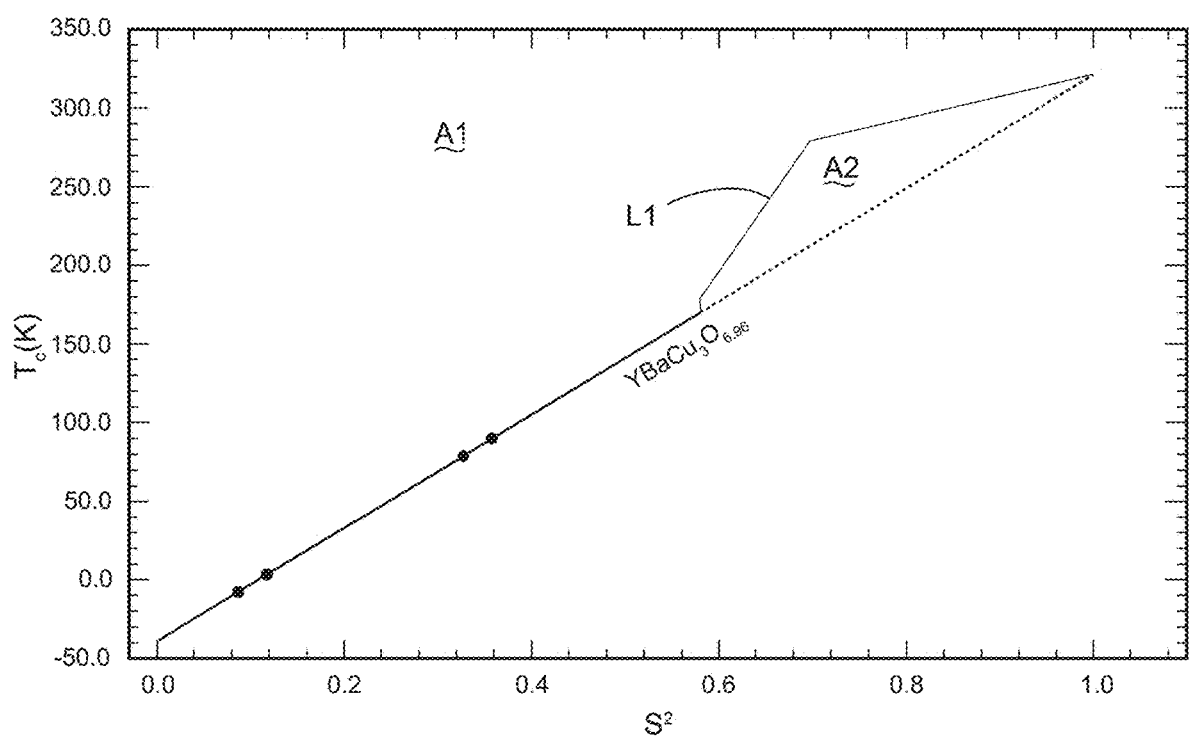
FIG. 7 is a plot of superconducting transition temperature as a function of long-range order parameter for nominally stoichiometric yttrium barium copper oxide.

FIG. 7 is a plot of superconducting transition temperature as a function of long-range order parameter $S^2$ for nominally stoichiometric yttrium barium copper oxide (a classic "Type II" oxide superconductor). The region A1 denotes potentially achievable transition temperatures that may be achieved by deviating from the stoichiometric $YBaCu_3O_{6.96}$ stoichiometric line. In FIG. 7, the region A2 below the line "L1" represents unphysical combinations that cannot be achieved. The methodology described herein demonstrates a potential pathway to room temperature superconductivity in $YBaCu_3O_{6.96}$ materials. In particular, the stoichiometry of superconducting materials can be controlled to fabricate materials having superconductivity at higher temperatures than nominally stoichiometric materials.

It will be understood that the plots shown in FIGS. 6 and 7 are merely examples of two materials that may achieve a superconducting state at increased temperatures by deviating from a nominally stoichiometric and fixed order parameter material. The present disclosure is therefore not limited to the examples of FIGS. 6 and 7.

Figure 8:
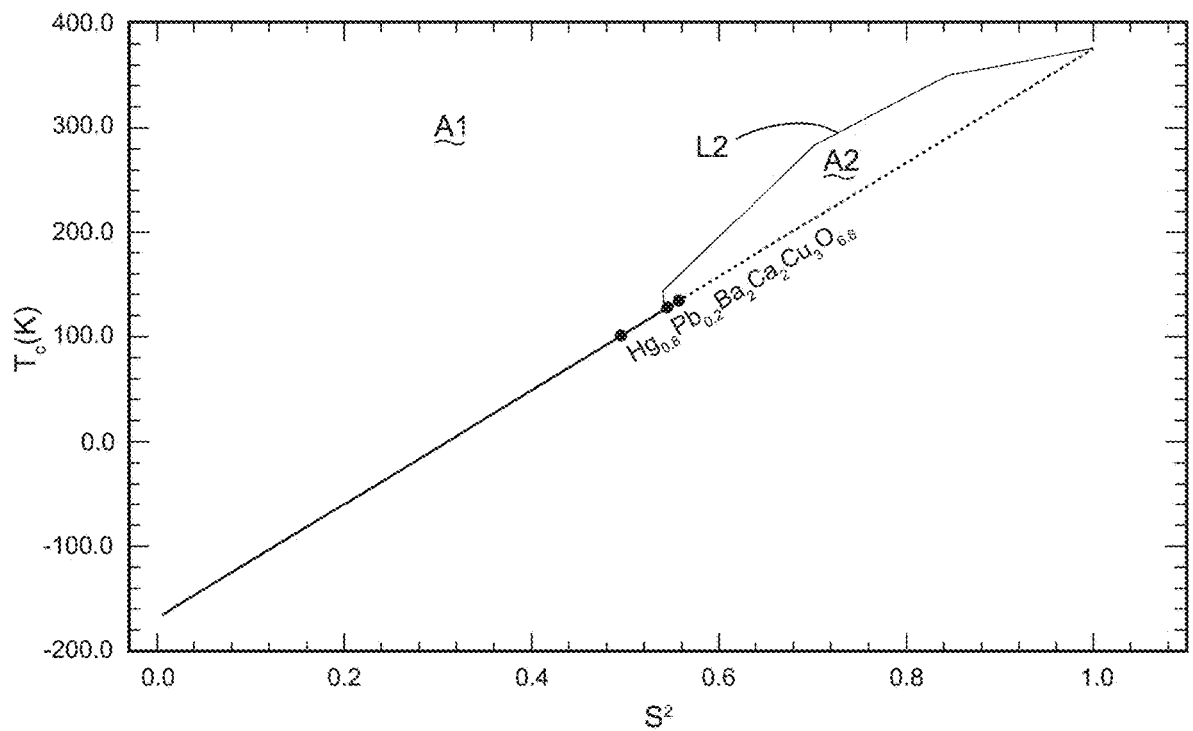
FIG. 8 is a plot of superconducting transition temperature as a function of long-range order parameter of HgPbBaCaCuO; the current record holder (without application of extreme pressures unfeasible for devices)

With further reference to FIG. 8, a plot of superconducting transition temperature as a function of long-range order $S^2$ for HgPbBaCaCuO includes a region A1 above the nominally stoichiometric line $Hg_{0.8}Pb_{0.2}Ba_2Ca_2Cu_3O_{6.8}$. Region A1 represents potentially achievable transition temperatures if the stoichiometry is varied. The region A2 above the nominally stoichiometric line and below the line L2 represents a region of unphysical combinations. The methodology described herein provides for an increase in the order parameter in conjunction deviations from stoichiometry to achieve superconductivity at room temperature and above.

A method according to the present disclosure may comprise determining a required band gap utilizing a predefined relationship between a band gap and a semiconductor material composition and long range cation ordering to determine a semiconductor material composition providing the required band gap, and controlling process variables to form a semiconductor device comprising at least one semiconductor material having a semiconductor material composition providing the required band gap.

The processes of the present disclosure may be utilized to fabricate a wide variety of devices such as a method of fabricating a semiconductor device. Non-limiting examples of devices that may be fabricated according to the present disclosure include gallium and indium free solar cells, far infrared and ultraviolet detectors, and power diodes and transistors. If an emitter (e.g., a green LED) is to be fabricated, the band gap of the emitting layer of the device is set to correspond to green. In known processes, this is typically done by either alloying (in the case of indium gallium nitride) or introducing an impurity level (as is done with gallium phosphide). To ensure the light is emitted from the correct layer of material, the band gap of the other layers is adjusted (tuned) to be slightly larger than the emitting layer. The bands represented in the plots with negative band gap values can be inverted. Band inversion may be a route to topological properties. In some cases, the operation of the device may not be effected by inversion of the bands.

In the case of an absorber, such as a detector (e.g., to capture the signal from an LED or laser diode), or a solar cell, or a thermophotovoltaic cell, there is typically a tradeoff associated with band gap energy. For example, for a solar cell, a very small band gap absorbs a high percentage of photons that hit the material, but the excess energy is largely wasted as heat. A very large band gap efficiently uses almost all of the photon energy, but since most photons are not absorbed, the efficiency tends to be lower. Thus, devices are typically fabricated to have band gaps that are between the extremes of small and large band gaps. For example, terrestrial single junction solar cells typically have a band gap of about 1.4 to about 1.6 electron volts (eV).

For a tandem junction cell, the band gap of a first layer is preferably about 1 eV and the band gap of the other layer is preferably about 1.6-1.7 eV. In this type of a device, an appropriate tunnel junction layer is also required, and materials are typically selected based on band line up.

A method according to the present disclosure may be utilized to adjust the conduction band of the selected materials up and down relative to the valence band or the vacuum level and to tune the band line up. For a detector, the band gap is typically smaller than the minimum photon energy that is to be detected. For example, the UV wavelengths relevant for monitoring exposure to human skin are approximately 3.5 eV and higher. For detecting a red light, a band gap of less than 2 eV is typically utilized. Infrared light detectors typically utilize materials having a band gap of about 0.6 eV (or more). Far infrared detectors may utilize smaller band gaps that may be just above zero eV.

The ability to tune the band gap energy over a wide energy range, from the maximum value (which could be in excess of 5 eV for some members of the family, achieved in the fully ordered, stoichiometric case) through zero and potentially to negative values (accessible in a small number of other semiconductor materials such as HgTe, but as an essentially fixed value) is not a material property per se. Rather, it is achieved through engineering the relative percentages of various structural motifs, for example, the cation sublattice (e.g. Zn and Sn, for $ZnSnN_2$, or Mg and Ge, for $MgGeN_2$). This may be applied to an anion sublattice as well. According to an aspect of the present disclosure, a fundamental material property (band gap energy) is circumvented through design of motif composition—within fundamental limits established by the material.

Plasma-assisted molecular beam epitaxy (PAMBE) may be utilized. However, other non-equilibrium techniques (such as metal organic chemical vapor deposition, or MOCVD) could also be utilized. Process parameters for PAMBE include substrate temperature; nitrogen active species (controlled primarily through nitrogen flow rate, but also potentially influenced by the applied RF power, or through utilizing an alternative type of active nitrogen source such as an electron cyclotron resonance (ECR) microwave frequency source, Kauffman-type ion source, or ammonia—the latter being potentially problematic at low substrate temperatures unless a suitable catalyst is identified); flux ratio of the metal species (e.g., Zn to Sn, or Mg to Ge); cation to anion flux ratio (e.g., zinc to nitrogen, or tin to nitrogen); growth rate; and strain induced by lattice mismatch with the selected substrate used in the deposition process.

The desired band gap energy may be dictated by the specific device application. For example, a single pn junction non-concentrator solar cell designed for use on earth can function over a range of material band gap energies, but optimal matching to the solar spectrum occurs over a range of approximately 1.4 to 1.6 eV. Multijunction (either vertically stacked, or horizontally distributed with lateral spectral dispersal) structures typically require several band gap energies to achieve high efficiency. According to the present disclosure, an application-specific band gap energy, once specified, is achieved by designing the motif percentages through cation ordering and stoichiometry necessary for the selected material. Thus, a particular band gap energy can be achieved from multiple materials within the family. Process parameters may be tuned (adjusted) to control both stoichiometry and order parameter.

Heterojunction semiconductor devices may provide improvement to key device characteristics, such as operational speed and current amplification properties. However, a potential issue with heterojunction devices is the lattice mismatch between the different semiconductors in the device. Lattice mismatching results in strain, which in turn induces changes in properties, including band gap energy, and often must be mitigated. Avoiding the deleterious effects of strain may, however, limit the band gap difference achievable between materials in heterojunction devices, which in turn limits the overall benefits achievable in such devices. The present disclosure provides for tuning the band gap via composition and disorder which may provide benefits in heterojunction devices. For example, tuning the band gap via disorder/composition typically results in relatively small changes to the lattice constants of the material, and thus materials with different compositions/disorder will have a small lattice mismatch with one another, resulting in very little strain between these layers when used in a multijunction device. This means that with very little effect from strain, the band gap difference at an interface in a heterojunction device can be significantly larger than possible with other known methods (such as alloying or using different materials). According to an aspect of the present disclosure, the desired range of band gap energies in a complex device such as a tandem solar cell or heterojunction bipolar transistor (where a narrower band gap energy base layer improves base transit time) can be achieved without necessarily changing composition and hence introducing strain. For example, a heterojunction LED could be implemented using disorder/composition tuning for higher light emitting efficiency. Also, a heterojunction BJT with a wide gap emitter could also be implemented using disorder/composition to tune the band gap and result in larger current amplification.

A solid state light emitting diode (LED) may also be fabricated according to the present disclosure. The LED may include an injector and a base region comprising a single semiconductor whose order parameter and/or stoichiometry has been tuned, such that the band gap of the material is larger in the injector region than in the base region.

A semiconductor junction transistor may also be fabricated according to the present disclosure. The transistor may comprise a base region and an emitter region, wherein the band gap is tuned through the order parameter and stoichiometry, such that a band gap of a semiconductor material in the emitter region is at least about as twice as large as the band gap of a semiconductor material in the base region.

A single pn junction non-concentrator solar cell may also be fabricated according to the present disclosure. The solar cell may include a semiconductor material whose band gap has been tuned through order parameter and/or stoichiometry to a value between about 1.4 eV and about 1.6 eV.

A multijunction (either vertically stacked, or horizontally) solar cell may also be fabricated according to the present disclosure. The multijunction solar cell may comprise a single semiconducting material, wherein each layer of the multijunction cell has its band gap tuned through composition and/or order parameter.

A tunnel diode may also be fabricated according to the present disclosure. The tunnel diode may comprise a single semiconductor material with first and second layers whose band gaps have been tuned using stoichiometric and/or order parameter, such that the top of the valence band for the first layer is at an energy level between the bottom of the conduction band and top of the valence band of the second layer.

Figure 9:
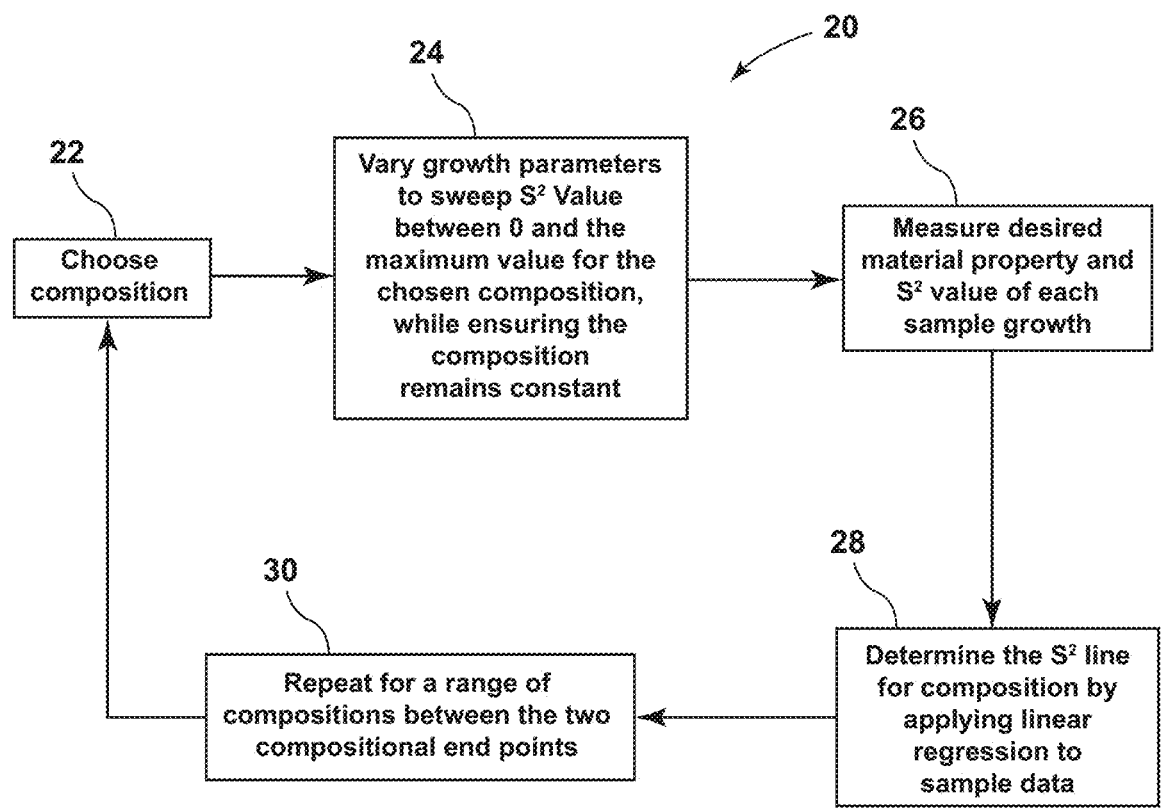
FIG. 9 is a flowchart showing a process for generating an order parameter dependence correlation or map according to an aspect of the present disclosure.

With further reference to FIG. 9, a process 20 according to an aspect of the present disclosure provides for generating an $S^2$ dependence map for a property of a material system (e.g., FIG. 3). A first step 22 involves choosing a composition. A second step 24 includes varying growth parameters to sweep the $S^2$ value between 0 and the maximum value for the chosen composition, while ensuring the composition remains constant. A third step 26 includes measuring a desired material property (e.g., band gap) and an $S^2$ value for each sample. A fourth step 28 includes determining the $S^2$ line for the composition by applying linear regression to the sample data. Step 30 includes repeating the process for a range of compositions between the two compositional endpoints. In general, each time steps 22-28 are repeated for a specific composition, it will result in a line as shown, for example, in FIG. 3. Thus, in FIG. 3, each of steps 22-28 are repeated for six different compositions. It will be understood that the number of compositions tested may vary as required for a particular application. Also, the process 20 may be utilized in connection with a wide variety of materials (see also FIG. 4).

Figure 10:
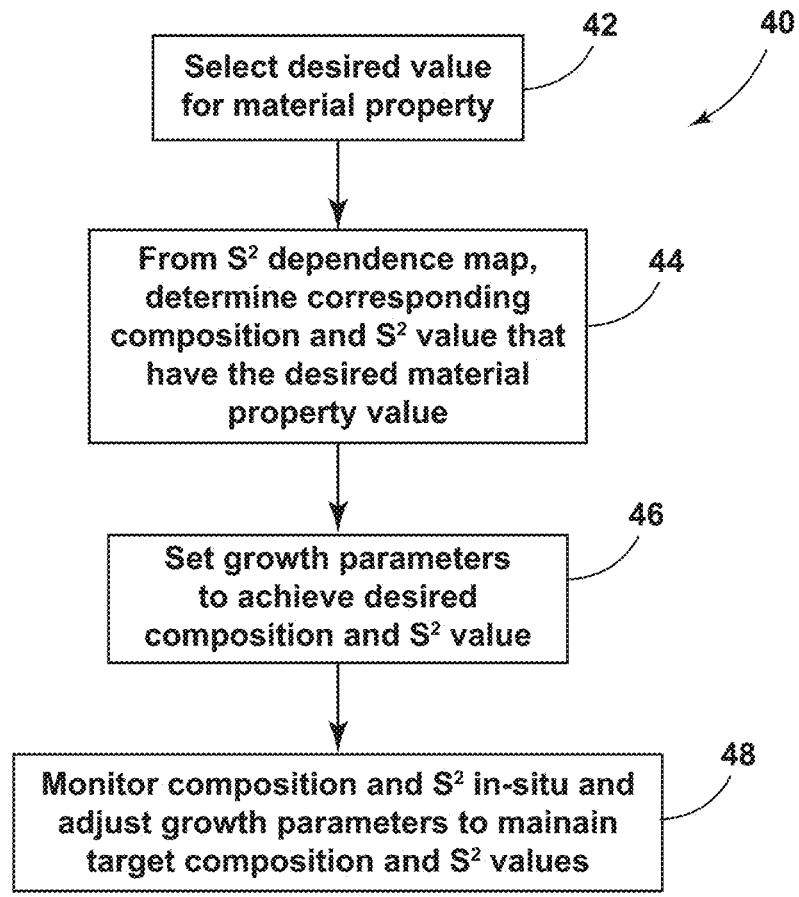
FIG. 10 is a flowchart showing a process for obtaining a desired (target) value for a material property according to another aspect of the present disclosure.

With further reference to FIG. 10, a process for fabricating a material includes a first step 42. The first step 42 comprises selecting a desired value for a material property (e.g., band gap). A second step 42 comprises utilizing a dependence map (e.g., produced using the process of FIG. 9). Step 44 comprises determining a corresponding composition and $S^2$ value that has the desired material property value (e.g., band gap). Step 46 comprises setting growth parameters of the semiconductor crystal growth process to achieve the desired composition and $S^2$ value. It will be understood that step 46 may vary depending on the specific process utilized to grow the semiconductor crystal. As shown in step 48, the composition and $S^2$ may be monitored in-situ, and the growth parameters may be adjusted to maintain the target composition and $S^2$ values. It will be understood that a process of fabricating a material having a desired material property (e.g., band gap) according to the present disclosure would not necessarily require use of an $S^2$ dependence map. In general, virtually any correlation between a desired material property and $S^2$ may be utilized to control a process to provide the desired material property.

Synthesis of semiconductor materials can be largely separated into two categories: (1) bulk crystals and (2) thin films. Bulk crystal synthesis may be utilized to fabricate electronic devices, such as solar cells and integrated circuits. After the bulk crystals are formed, the bulk crystals may cut (e.g., sawn) into wafers and polished prior to device fabrication. In the case of thin films, the layer film may be as thin as one atom, although a range of several nanometers to several microns is common. The layer is generally the basis for the active region of an electronic device. The layer may be deposited using a variety of manufacturing techniques onto a mechanically supporting substrate of the same or dissimilar material.

The following discussion includes examples of how materials may be manufactured in the context of the present disclosure. However, it will be understood that virtually any suitable process may be utilized, and the present disclosure is not limited to any specific fabrication processes or techniques. A material that is deposited/formed without discernable long-range order may be referred to as a "semiconductor crystal" or an "amorphous" material. The term "polycrystalline" may refer to a material with intermediate crystallinity. As used herein, the term "crystal" generally describes a semiconductor material with an order parameter ranging between about 0 and about 1.

For many synthesis techniques (processes), post-formation thermal treatment, also referred to as annealing, may be performed to adjust/control the order parameter of a material. In general, annealing may be performed either in a vacuum, an inert atmosphere (e.g., a gas such as argon), or a reactive atmosphere (e.g., a constituent gas, possibly modified by thermal treatment or plasma). The temperature profile (heating and cooling rates) of the annealing process can also be tuned (adjusted) to achieve a desired (target) order parameter value.

For crystal manufacturing processes, a separate calibration process may be required in some cases. The calibration process may vary depending on the specific process and equipment utilized to fabricate the crystals during the crystal growth/deposition process.

Epitaxial thin film growth processes include molecular beam epitaxy (MBE) and metalorganic chemical vapor deposition (MOCVD).

Growth parameters associated with MBE-based crystal manufacturing include, but are not limited to, substrate temperature, constituent arrival rate or "flux," typically measured in atoms/cm$^2$·s or beam equivalent pressure, flux ratio, growth rate, substrate orientation, surface preparation, and substrate order parameter. Characteristics of an activated species may be an important parameter in MBE in some cases. With regards to activated species, if nitrogen is utilized in a plasma condition, the ratio of different species can be varied through applied radio frequency or microwave power as well as flow rate. Another example is arsenic, which may be thermally cracked into dimer or monomer species. The order parameter of any intermediate buffer layers or structures (such as strained layer structures) may also be an important parameter in some cases.

Parameters associated with MOCVD-based thin film crystal growth include, but are not limited to, substrate temperature, precursor composition, precursor ratio, catalysts used to vary the deposition temperature, growth rate, substrate orientation and surface preparation, substrate order parameter, and order parameter of any intermediate buffer layers or structures (such as strained layer structures). The characteristics of an activated species may be an important parameter in some cases. For example, if nitrogen in a plasma condition is utilized, the ratio of different species can be varied through applied radio frequency or microwave power as well as flow rate.

Bulk crystal growth may comprise a liquid encapsulated Czochralski (LEC) process or a hydrothermal (HT) process. Various growth parameters of Czochralski bulk crystal growth processes can be changed (adjusted) to control the order parameter of the bulk crystal. Examples of parameters that can be adjusted include the order parameter of the seed crystal, the temperature of the melt, the temperature and pressure of the growth chamber, the pulling speed, and the rotational speed.

Various parameters of a hydrothermal (HT) synthesis of crystals can also be changed (adjusted) to control the order parameter of the resulting crystal. Examples include the order parameter of the seed crystal, the pressure of the autoclave or vessel, the temperature of the vessel (or temperature gradient across the vessel), precursor composition, composition of catalysts and solvents used, the power of microwave irradiation (if used), stirring cycle profile (e.g., stirring times, stirring speeds, rest times, and temperatures during each part), washing (e.g., composition of washing chemicals, temperature and duration of washing) and drying profile (e.g., time and rate of drying).

Physical deposition processes may involve radio frequency (RF) or direct current (DC) sputtering. Various growth parameters of RF and DC sputtering procedures may be tuned (adjusted) to control order parameter. Examples include, but are not limited to, substrate temperature, substrate bias, composition of a sputtering gas, chamber pressure, and applied power. Additionally, target composition, growth rate, and substrate composition may also be tuned/adjusted to control the order parameter of the materials. The orientation and position of the anode relative to the cathode may also be adjusted. The surface preparation may also be varied to control the order parameter.

In general, as discussed above, correlations between order parameter, stoichiometry, and band gap may be utilized to provide a desired band gap as required for a particular application (device).

It is to be understood that variations and modifications can be made on the aforementioned structure without departing from the concepts of the present invention, and further it is to be understood that such concepts are intended to be covered by the following claims unless these claims by their language expressly state otherwise.

The invention claimed is:

1. A method of fabricating a superconducting device, the method comprising:
   determining a target transition temperature;
   utilizing a predefined quantitative relationship between superconducting transition temperature and an order parameter (S) for at least one superconductor material composition to select a superconductor material composition that is capable of providing the target transition temperature, wherein the quantitative relationship can be expressed as a linear relationship between superconducting transition temperature and order parameter square ($S^2$); and
   controlling process parameters to form a superconductor device comprising at least one superconductor material having the selected superconductor material composition and the target transition temperature.

2. The method of claim 1, wherein:
   the superconductor device comprises a superconducting quantum interference device (SQUID).

3. The method of claim 1, wherein:
   the superconductor device comprises a bolometer.

4. The method of claim 1, wherein the superconductor device comprises a superconducting electrical connection.

5. A method of fabricating a superconducting device, the method comprising:
   determining a target transition temperature;
   determining an order parameter (S) for a selected superconducting material based on a predefined numerical relationship between a superconducting transition temperature and S for the selected superconductor material, wherein the numerical relationship between superconducting transition temperature and S for the selected superconductor material is fully predictive of superconducting transition temperature as a function of S; and
   controlling process parameters to form a superconducting device comprising the selected superconductor material having the target transition temperature; wherein
   the numerical relationship can be expressed as a linear relationship between superconducting transition temperature and order parameter squared $S^2$.

6. The method of claim 5, wherein:
   the superconductor device comprises a superconducting quantum interference device (SQUID).

7. The method of claim 5, wherein:
   the superconductor device comprises a bolometer.

8. The method of claim 5, wherein the superconductor device comprises a superconducting electrical connection.

* * * * *